United States Patent
Lee et al.

(10) Patent No.: US 8,124,907 B2
(45) Date of Patent: Feb. 28, 2012

(54) LOAD LOCK CHAMBER WITH DECOUPLED SLIT VALVE DOOR SEAL COMPARTMENT

(75) Inventors: Jae-Chull Lee, San Jose, CA (US); Suhail Anwar, San Jose, CA (US); Shinichi Kurita, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1216 days.

(21) Appl. No.: 11/782,267

(22) Filed: Jul. 24, 2007

(65) Prior Publication Data

US 2008/0087214 A1    Apr. 17, 2008

Related U.S. Application Data

(60) Provisional application No. 60/821,487, filed on Aug. 4, 2006.

(51) Int. Cl.
*B23K 10/00* (2006.01)
(52) U.S. Cl. ......... 219/121.43; 219/121.58; 219/121.41; 156/345.54
(58) Field of Classification Search ............. 219/121.43, 219/121.41, 121.44, 121.58; 118/723 R, 118/723 MW; 315/111.21; 156/345.33, 156/345.31, 345.54, 345.55
See application file for complete search history.

(56) References Cited

U.S. PATENT DOCUMENTS

| | | | |
|---|---|---|---|
| 3,976,330 A | 8/1976 | Babinski et al. | |
| 4,047,624 A | 9/1977 | Dorenbos | |
| 4,178,113 A | 12/1979 | Beaver, II et al. | |
| 4,311,542 A | 1/1982 | Mueller et al. | |
| 4,512,391 A | 4/1985 | Harra | |
| 4,680,061 A | 7/1987 | Lamont, Jr. | |
| 4,687,542 A | 8/1987 | Davis et al. | |
| 4,693,777 A | 9/1987 | Hazano et al. | |
| 4,709,655 A | 12/1987 | Van Mastrigt | |
| 4,759,681 A | 7/1988 | Nogami | |
| 4,770,590 A | 9/1988 | Hugues et al. | |
| 4,775,281 A | 10/1988 | Prentakis | |
| 4,784,377 A | 11/1988 | Woodward | |
| 4,785,962 A | 11/1988 | Toshima | |
| 4,801,241 A | 1/1989 | Zajac et al. | |
| 4,816,098 A | 3/1989 | Davis et al. | |
| 4,828,224 A | 5/1989 | Crabb et al. | |

(Continued)

FOREIGN PATENT DOCUMENTS

CN    1789485    6/2006

(Continued)

OTHER PUBLICATIONS

CN Office Action No. 200780027858.5 dated Jan. 29, 2010.

(Continued)

*Primary Examiner* — Mark Paschall
(74) *Attorney, Agent, or Firm* — Patterson & Sheridan, L.L.P.

(57) ABSTRACT

Embodiments of the invention include a load lock chamber having a decoupled slit valve door seal compartment. In one embodiment, a load lock chamber includes a main assembly, a first slit valve door seal compartment and a seal assembly. The main assembly has a substrate transfer cavity formed therein. Two substrate access ports are formed through the main assembly and fluidly couple to the cavity. The first slit valve door seal compartment has an aperture disposed adjacent to and aligned with one of the access ports. The first slit valve door seal compartment is decoupled from the main assembly. The seal assembly couples the first slit valve door seal compartment to the main assembly.

20 Claims, 13 Drawing Sheets

U.S. PATENT DOCUMENTS

| | | | |
|---|---|---|---|
| 4,836,733 A | 6/1989 | Hertel et al. | |
| 4,846,102 A | 7/1989 | Ozias | |
| 4,857,689 A | 8/1989 | Lee | |
| 4,863,547 A | 9/1989 | Shidahara et al. | |
| 4,870,923 A | 10/1989 | Sugimoto | |
| 4,895,107 A | 1/1990 | Yano et al. | |
| 4,897,963 A | 2/1990 | Reboul et al. | |
| 4,911,103 A | 3/1990 | Davis et al. | |
| 4,913,929 A | 4/1990 | Moslehi et al. | |
| 4,923,584 A | 5/1990 | Bramhall, Jr. et al. | |
| 4,951,601 A | 8/1990 | Maydan et al. | |
| 4,952,299 A | 8/1990 | Chrisos et al. | |
| 4,966,519 A | 10/1990 | Davis et al. | |
| 4,989,543 A | 2/1991 | Schmitt | |
| 4,990,047 A | 2/1991 | Wagner et al. | |
| 5,001,327 A | 3/1991 | Hirasawa et al. | |
| 5,020,475 A | 6/1991 | Crabb et al. | |
| 5,044,871 A | 9/1991 | Davis et al. | |
| 5,060,354 A | 10/1991 | Chizinsky | |
| 5,131,460 A | 7/1992 | Krueger | |
| 5,186,718 A | 2/1993 | Tepman et al. | |
| 5,187,115 A | 2/1993 | Coleman | |
| 5,199,483 A | 4/1993 | Bahng | |
| 5,202,716 A | 4/1993 | Tateyama et al. | |
| 5,224,809 A | 7/1993 | Maydan et al. | |
| 5,227,708 A | 7/1993 | Lowrance | |
| 5,252,807 A | 10/1993 | Chizinsky | |
| 5,254,170 A | 10/1993 | Devibiss et al. | |
| 5,259,881 A | 11/1993 | Edwards et al. | |
| 5,259,883 A | 11/1993 | Yamabe et al. | |
| 5,261,935 A | 11/1993 | Ishii et al. | |
| 5,288,379 A | 2/1994 | Namiki et al. | |
| 5,292,393 A | 3/1994 | Maydan et al. | |
| 5,314,574 A | 5/1994 | Takahashi | |
| 5,352,294 A | 10/1994 | White et al. | |
| 5,355,066 A | 10/1994 | Lowrance | |
| 5,374,147 A | 12/1994 | Hiroki et al. | |
| 5,376,212 A | 12/1994 | Saiki | |
| 5,404,894 A | 4/1995 | Shiraiwa | |
| 5,421,889 A | 6/1995 | Pollock et al. | |
| 5,443,346 A | 8/1995 | Murata et al. | |
| 5,445,484 A | 8/1995 | Kato et al. | |
| 5,447,409 A | 9/1995 | Grunes et al. | |
| 5,464,313 A | 11/1995 | Ohsawa | |
| 5,469,035 A | 11/1995 | Lowrance | |
| 5,470,784 A | 11/1995 | Coleman | |
| 5,474,410 A | 12/1995 | Ozawa et al. | |
| 5,512,320 A | 4/1996 | Turner et al. | |
| 5,516,732 A | 5/1996 | Flegal | |
| 5,536,128 A | 7/1996 | Shimoyashiro et al. | |
| 5,562,383 A | 10/1996 | Iwai et al. | |
| 5,570,994 A | 11/1996 | Somekh et al. | |
| 5,586,585 A | 12/1996 | Bonora et al. | |
| 5,588,827 A | 12/1996 | Muka | |
| 5,607,009 A | 3/1997 | Turner et al. | |
| 5,609,689 A | 3/1997 | Kato et al. | |
| 5,611,655 A | 3/1997 | Fukasawa et al. | |
| 5,611,865 A | 3/1997 | White et al. | |
| 5,615,988 A | 4/1997 | Wiesler et al. | |
| 5,616,208 A | 4/1997 | Lee | |
| 5,636,964 A | 6/1997 | Somekh et al. | |
| 5,655,277 A | 8/1997 | Galdos et al. | |
| 5,674,786 A | 10/1997 | Turner et al. | |
| 5,685,684 A | 11/1997 | Kato et al. | |
| 5,695,568 A | 12/1997 | Sinha et al. | |
| 5,697,749 A | 12/1997 | Iwabuchi et al. | |
| 5,700,127 A | 12/1997 | Harada et al. | |
| 5,716,207 A | 2/1998 | Mishina et al. | |
| 5,738,767 A | 4/1998 | Coad et al. | |
| 5,751,003 A | 5/1998 | Rose et al. | |
| 5,784,799 A | 7/1998 | Kato et al. | |
| 5,793,050 A | 8/1998 | Rose et al. | |
| 5,795,355 A | 8/1998 | Moran | |
| 5,820,679 A | 10/1998 | Yokoyama et al. | |
| 5,833,426 A | 11/1998 | Marohl | |
| 5,855,681 A | 1/1999 | Maydan et al. | |
| 5,855,726 A | 1/1999 | Soraoka et al. | |
| 5,882,165 A | 3/1999 | Maydan et al. | |
| 5,884,009 A | 3/1999 | Okase | |
| 5,891,251 A | 4/1999 | MacLeish et al. | |
| 5,902,088 A | 5/1999 | Faribairn et al. | |
| 5,909,994 A | 6/1999 | Blum et al. | |
| 5,913,978 A | 6/1999 | Kato et al. | |
| 5,934,856 A | 8/1999 | Asakawa et al. | |
| 5,942,013 A | 8/1999 | Akimoto | |
| 5,944,857 A | 8/1999 | Edwards et al. | |
| 5,951,770 A | 9/1999 | Perlov et al. | |
| 5,954,472 A | 9/1999 | Hofmeister et al. | |
| 5,961,269 A | 10/1999 | Kroeker | |
| 5,989,346 A | 11/1999 | Hiroki | |
| 5,997,235 A | 12/1999 | Hofmeister | |
| 6,007,675 A | 12/1999 | Toshima | |
| 6,012,192 A | 1/2000 | Sawada et al. | |
| 6,016,611 A | 1/2000 | White et al. | |
| 6,034,000 A | 3/2000 | Heyder et al. | |
| 6,039,770 A | 3/2000 | Yang et al. | |
| 6,042,623 A | 3/2000 | Edwards | |
| 6,044,534 A | 4/2000 | Seo et al. | |
| 6,048,154 A | 4/2000 | Wytman | |
| 6,059,507 A | 5/2000 | Adams | |
| 6,079,693 A | 6/2000 | Ettinger et al. | |
| 6,082,950 A | 7/2000 | Altwood et al. | |
| 6,086,362 A | 7/2000 | White et al. | |
| 6,089,543 A | 7/2000 | Freerks | |
| 6,106,634 A | 8/2000 | Ghanayem et al. | |
| 6,143,083 A | 11/2000 | Yonemitsu et al. | |
| 6,145,673 A | 11/2000 | Burrows et al. | |
| 6,176,667 B1 | 1/2001 | Fairbairn et al. | |
| 6,176,668 B1 | 1/2001 | Kurita et al. | |
| 6,192,827 B1 | 2/2001 | Welch et al. | |
| 6,193,507 B1 | 2/2001 | White et al. | |
| 6,206,176 B1 | 3/2001 | Blonigan | |
| 6,213,704 B1 | 4/2001 | White et al. | |
| 6,215,897 B1 | 4/2001 | Beer et al. | |
| 6,224,680 B1 | 5/2001 | Toshima | |
| 6,235,634 B1 | 5/2001 | White et al. | |
| 6,250,869 B1 | 6/2001 | Kroeker | |
| 6,254,328 B1 | 7/2001 | Wytman | |
| 6,270,582 B1 | 8/2001 | Rivkin et al. | |
| 6,286,230 B1 | 9/2001 | White et al. | |
| 6,315,512 B1 | 11/2001 | Tabrizi et al. | |
| 6,318,945 B1 | 11/2001 | Hofmeister | |
| 6,338,626 B1 | 1/2002 | Saeki | |
| 6,340,405 B2 | 1/2002 | Park | |
| 6,382,895 B1 | 5/2002 | Konishi et al. | |
| 6,410,455 B1 | 6/2002 | Kuribayashi et al. | |
| 6,431,807 B1 | 8/2002 | Stevens et al. | |
| 6,435,868 B2 | 8/2002 | White et al. | |
| 6,450,750 B1 | 9/2002 | Heyder et al. | |
| 6,486,444 B1 | 11/2002 | Fairbairn et al. | |
| 6,503,365 B1 | 1/2003 | Kim et al. | |
| 6,517,303 B1 | 2/2003 | White et al. | |
| 6,558,509 B2 | 5/2003 | Kraus et al. | |
| 6,568,552 B1 | 5/2003 | Tabrizi et al. | |
| 6,568,899 B1 | 5/2003 | Kuribayashi et al. | |
| 6,602,797 B2 | 8/2003 | Kuribayashi et al. | |
| 6,609,869 B2 | 8/2003 | Aggarwal et al. | |
| 6,610,150 B1 | 8/2003 | Savage et al. | |
| 6,647,665 B1 | 11/2003 | Tabrizi et al. | |
| 6,949,143 B1 | 9/2005 | Kurita et al. | |
| 7,282,097 B2 * | 10/2007 | Tanase et al. | 118/733 |
| 2002/0034886 A1 | 3/2002 | Kurita et al. | |
| 2002/0137346 A1 | 9/2002 | Donaldson et al. | |
| 2002/0159864 A1 | 10/2002 | Lowrance | |
| 2003/0026677 A1 | 2/2003 | Sakashita et al. | |
| 2004/0119240 A1 | 6/2004 | Hashimoto | |
| 2004/0149210 A1 | 8/2004 | Fink | |
| 2004/0206921 A1 * | 10/2004 | Blonigan et al. | 251/113 |
| 2005/0095088 A1 | 5/2005 | Kurita et al. | |
| 2005/0285992 A1 | 12/2005 | White | |
| 2006/0028596 A1 | 2/2006 | Leung | |
| 2007/0166133 A1 * | 7/2007 | Lee et al. | 414/217 |
| 2011/0120017 A1 * | 5/2011 | Bang et al. | 49/137 |

FOREIGN PATENT DOCUMENTS

| | | |
|---|---|---|
| KR | 1020030016188 A | 2/2003 |
| KR | 20040013294 | 2/2004 |
| TW | 0461013 B | 10/2001 |
| TW | 0463207 B | 11/2001 |
| TW | 0554390 B | 9/2003 |
| TW | 0554504 B | 9/2003 |
| WO | WO-00/02228 | 1/2000 |
| WO | WO-02/05330 A2 | 1/2002 |
| WO | WO-03/023829 A2 | 3/2003 |

OTHER PUBLICATIONS

PCT Search Report and Written Opinion in PCT/US07/75190 dated Jul. 8, 2008, 9 pages.

* cited by examiner

LOAD LOCK CHAMBER WITH DECOUPLED SLIT VALVE DOOR SEAL COMPARTMENT

CROSS REFERENCE TO RELATED APPLICATIONS

This application claims benefit of U.S. Provisional Patent Application Ser. No. 60/821,487, filed Aug. 4, 2006 by Lee et al., which is incorporated by reference in its entirety.

This application is related to U.S. patent application Ser. No. 11/782,290, filed Jul. 24, 2007 by Anwar, et al., entitled "Load Lock Chamber With Heater in Tube", which is incorporated by reference in its entirety.

BACKGROUND OF THE INVENTION

1. Field of the Invention

Embodiments of the invention generally relate to a load lock chamber for a vacuum processing system, and more specifically, to a load lock chamber having a decoupled slit valve door seal compartment.

2. Description of the Related Art

Two rapidly evolving technology areas are thin film transistors and photovoltaic devices. Thin film transistors (TFT) formed by flat panel technology are commonly used for active matrix displays such as computer and television monitors, cell phone displays, personal digital assistants (PDAs), and an increasing number of other devices. Generally, flat panels comprise two glass plates having a layer of liquid crystal materials sandwiched therebetween. At least one of the glass plates includes one conductive film disposed thereon that is coupled to a power source. Power, supplied to the conductive film from the power source, changes the orientation of the crystal material, creating a pattern display.

Photovoltaic devices (PV) or solar cells are devices which convert sunlight into direct current (DC) electrical power. PV or solar cells typically have one or more p-n junctions formed on a panel. Each junction comprises two different regions within a semiconductor material where one side is denoted as the p-type region and the other as the n-type region. When the p-n junction of the PV cell is exposed to sunlight (consisting of energy from photons), the sunlight is directly converted to electricity through the PV effect. In general, a high quality silicon-based material is desired to produce high efficiency junction devices (i.e., high power output per unit area). Amorphous silicon (a-Si) film has been widely used as the silicon-based panel material in PV solar cells due to its low cost to manufacture in conventional low temperature plasma enhanced chemical vapor deposition (PECVD) processes.

With the marketplace's acceptance of flat panel technology and desire for more efficient PV devices to offset spiraling energy costs, the demand for larger panels, increased production rates and lower manufacturing costs have driven equipment manufacturers to develop new systems that accommodate larger size substrates for flat panel display and PV device fabricators. Current substrate processing equipment is generally configured to accommodate substrates slightly greater than about two square meters. Processing equipment configured to accommodate larger substrate sizes is envisioned in the immediate future.

Equipment to fabricate such large substrates represents a substantial investment to fabricators. Conventional systems require large and expensive hardware. Due to the large pressure differentials experienced during operation of the load lock chamber, the walls of the load lock chamber must be very thick in order to minimize deflection. Chamber deflection contributes to and/or causes a myriad of processing issues, some of which include non-uniform spacing between thermal regulating features and the substrate that causes heat transfer non-uniformities, movement of substrate supports within the processing chamber which creates robotic handoff issues, diminished seal life and particle generation. However, increasing the wall thickness to the extent necessary to mitigate these problems would result in a chamber body having unacceptable weight and costs, and as such, other solutions to limit and/or isolate chamber deflection would be very desirable.

Thus, there is a need for a load lock chamber for efficient transferring of large area substrates.

SUMMARY OF THE INVENTION

Embodiments of the invention include a load lock chamber having a decoupled slit valve door seal compartment. In one embodiment, a load lock chamber includes a main assembly, a first slit valve door seal compartment and a seal assembly. The main assembly has a substrate transfer cavity formed therein. Two substrate access ports are formed through the main assembly and fluidly couple to the cavity. The first slit valve door seal compartment has an aperture disposed adjacent to and aligned with one of the access ports. The first slit valve door seal compartment is decoupled from the main assembly. The seal assembly couples the first slit valve door seal compartment to the main assembly.

In another embodiment, a load lock chamber includes a main assembly, a first slit valve door seal compartment, a slit valve door and an annular resilient seal. The main assembly has a substrate transfer cavity. Two substrate access ports are formed through the main assembly and fluidly couple to the cavity. The first slit valve door seal compartment has a substrate transfer passage. The substrate transfer passage has a port adjacent that is aligned with one of the access ports of the main assembly. The first slit valve door seal compartment is decoupled from the main assembly. The slit valve door engages a sealing face of the door seal compartment to selectively seal the substrate transfer passage. The annular resilient seal forms a seal between the first slit valve door seal compartment to the main assembly.

In yet another embodiment, a load lock chamber includes a main assembly, a first slit valve door seal compartment, a slit valve door and an annular resilient seal. The main assembly has a substrate transfer cavity and two substrate access ports. The two substrate access ports are fluidly coupled to the cavity through the main assembly. The first slit valve door seal compartment has a substrate transfer passage in which the slit valve door is disposed. The slit valve door is operational to selectively engage a sealing face of the door seal compartment to selectively seal the substrate transfer passage. The annular resilient seal forms a seal between the first slit valve door seal compartment to the main assembly.

BRIEF DESCRIPTION OF THE DRAWINGS

So that the manner in which the above recited features of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures. It is contemplated that elements of one embodiment may be advantageously utilized in other embodiments without further recitation.

DETAILED DESCRIPTION

A load lock chamber having a decoupled slit valve door seal compartment suitable for efficient transfer of large area substrates is provided. The slit valve door seal compartment has much less surface area compared to the main chamber body assembly of the load lock chamber. Thus, forces, such as thermal expansion or deflection due to pressure or other forces, applied to the component of the chamber body assembly, are isolated from the slit valve door seal compartment, and according do not impart any significant motion or deflection to the seal compartment. Hence, the term decoupled defines the ability of chamber body assembly to move or deflect relative to the sealing surfaces without compromising the vacuum integrity of the chamber. This beneficially maintains slit valve door sealing surfaces defined on the seal compartment within operational tolerances and may contribute to reduced particle generation during operation, along with extending the service life of the slit valve door seal. Although the primary embodiment is described as a load lock chamber, it is contemplated that other vacuum chambers, e.g., such as a substrate transfer, chemical vapor deposition, physical vapor deposition, thermal processing, etch, ion implant or other vacuum chamber may be constructed using the decoupled seal compartment configuration described herein. Additionally, even though the specific embodiment of a chamber having a decoupled seal compartment is provided below with reference to a load lock chamber of a configuration available from Applied Materials, Inc., of Santa Clara, Calif., it is contemplated that the inventive features may be adapted for use in other load lock, thermal, and/or vacuum processing chambers, including those from other manufacturers.

Figure 1:
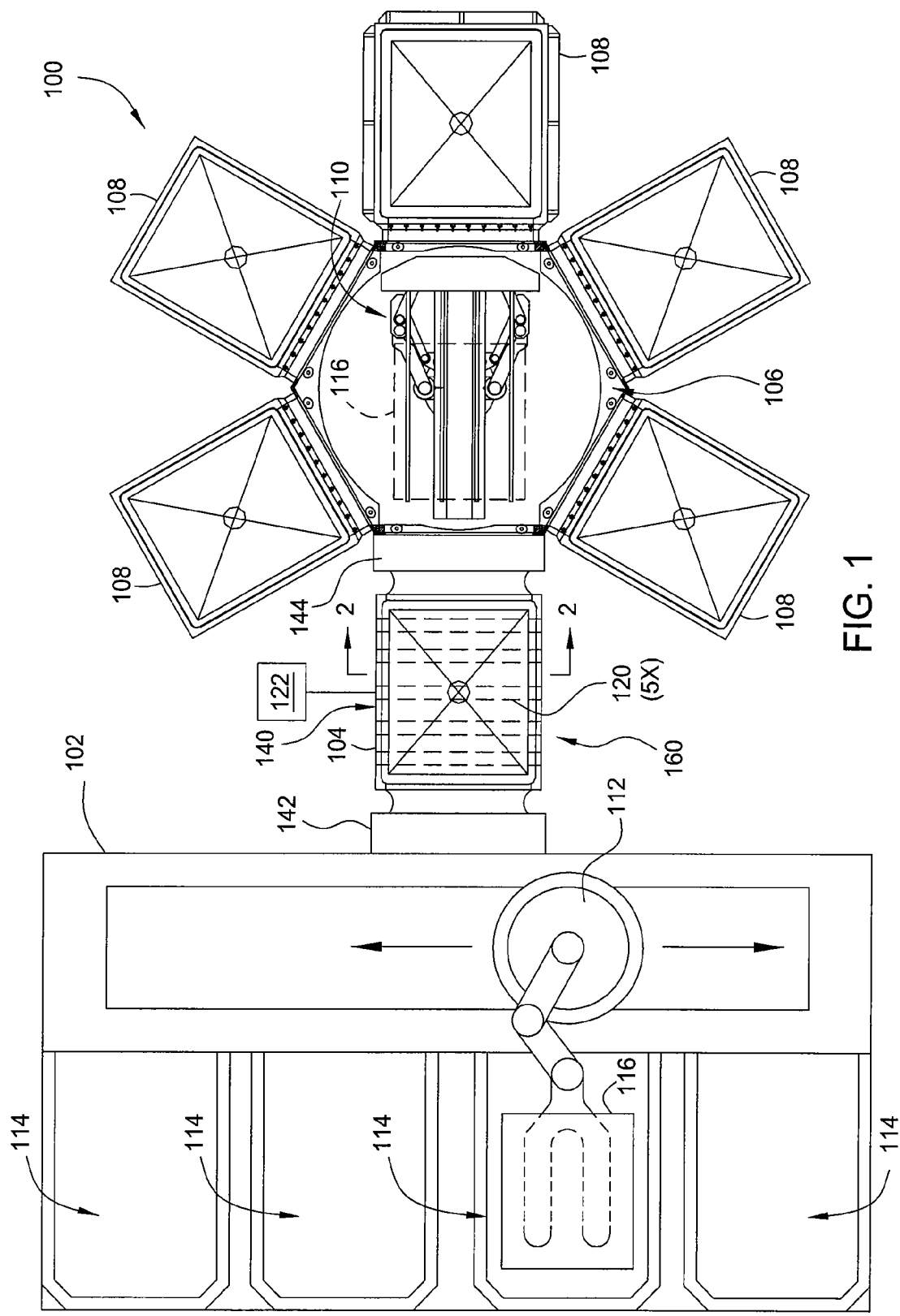
FIG. 1 is a plan view of an illustrative cluster tool having one embodiment of a load lock chamber of the present invention.

FIG. 1 is a plan view of an illustrative cluster tool 100 having one embodiment of a load lock chamber 104 of the present invention. The cluster tool 100 includes a factory interface 102 coupled by the load lock chamber 104 to a transfer chamber 106. The factory interface 102 generally includes a plurality of substrate storage cassettes 114 and an atmospheric robot 112. The atmospheric robot 112 facilitates transfer of substrates 116 between the cassettes 114 and the load lock chamber 104. A plurality of substrate processing chambers 108 are coupled to the transfer chamber 106. A vacuum robot 110 is disposed in the transfer chamber 106 to facilitate transfer of a substrate 116 between the load lock chamber 104 and the processing chambers 108.

The load lock chamber 104 generally includes at least one environmentally-isolatable cavity having one or more substrate storage slots defined therein. In some embodiments, a plurality of environmentally-isolatable cavities may be provided, each having one or more substrate storage slots defined therein. The load lock chamber 104 is operated to transfer substrates 116 between an ambient or atmospheric environment of the factory interface 102 and the vacuum environment maintained in the transfer chamber 106.

A plurality of lamp assemblies 120, shown in phantom in FIG. 1, extend across the load lock chamber 104 generally perpendicular to the direction of travel of a substrate passing between the factory interface 102 and the transfer chamber 106 through the load lock chamber 102. The lamp assemblies 120 are coupled to a power source 122 so that substrates disposed in the load lock chamber 120 may be selectively heated. Although five lamp assemblies 120 are shown in the embodiment depicted in FIG. 1, it is contemplated that the load lock chamber 102 may be configured to contain more or less lamp assemblies 120, selected commiserate with heating requirements and geometry constraints. It is contemplated that other types of heaters may be utilized in place of, or in addition to the lamp assemblies 120.

The load lock chamber 104 generally includes a body assembly 160 having a main assembly 140 and at least one decoupled slit valve door seal compartment. The slit valve door seal compartment includes a surface to which the slit valve door seals against to environmentally isolate the interior of the load lock chamber 104. In the embodiment depicted in FIG. 1, a first slit valve door seal compartment 142 is disposed between the main assembly 140 and the factory interface 102, while a second slit valve door seal compartment 144 is disposed between the main assembly 140 and the transfer chamber 106.

Figure 2:
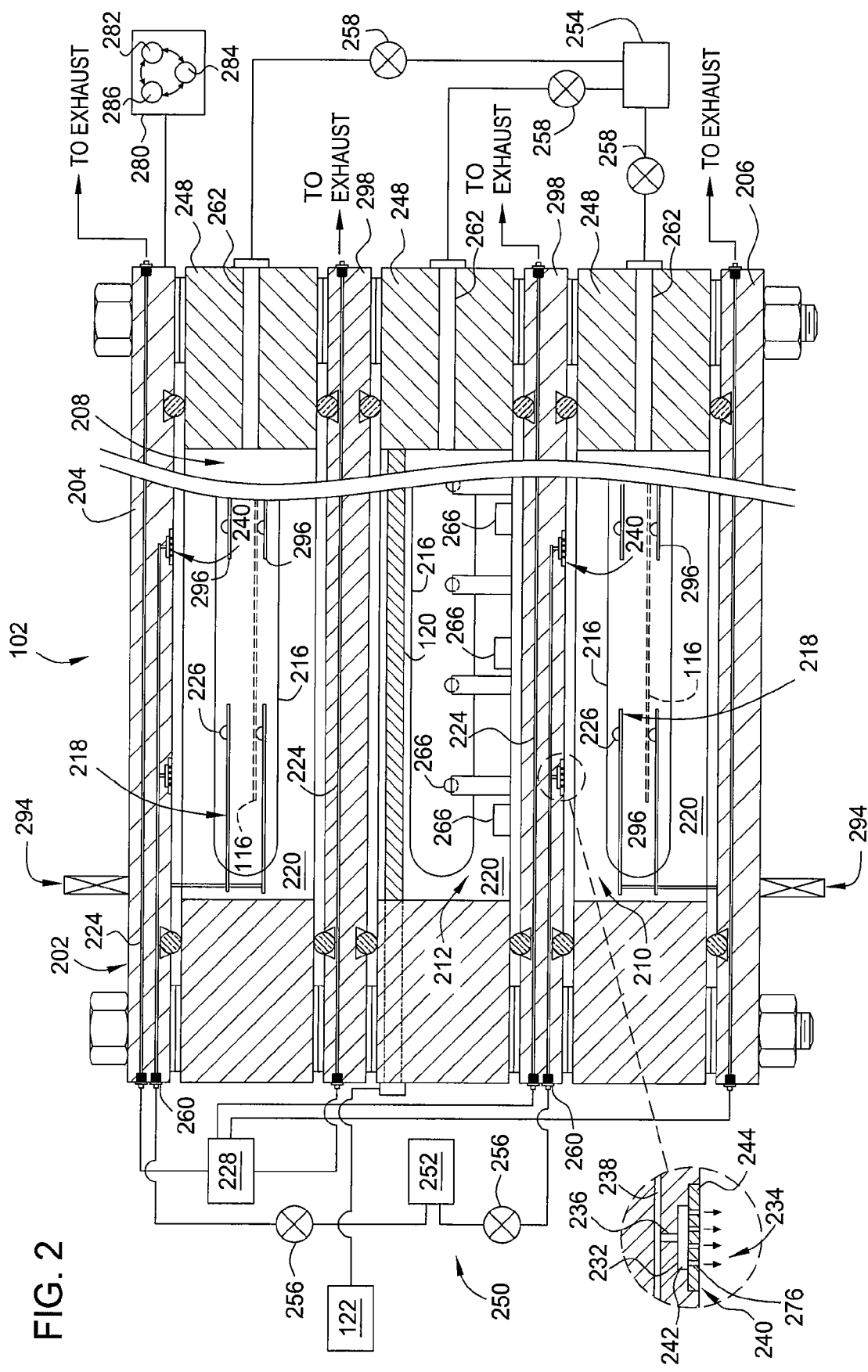
FIG. 2 is a sectional view of the load lock chamber taken along section line 2-2 of FIG. 1.

FIG. 2 further details the load lock chamber 104 of FIG. 1. Although the load lock chamber 104 is shown having a plurality of substrate transfer cavities, one of which having a lamp assembly 120 disposed therein, it is contemplated that the lamp assembly 120 may be utilized in any load lock chamber having at least one cavity utilized for substrate transfer, including load lock chambers having capacity greater than a single substrate per cavity.

The body assembly 160 is generally fabricated from a rigid material such as stainless steel, aluminum or other suitable material. The body assembly 160 may be fabricated from an assembly of components into a leak-free structure. The main assembly 140 may be a singular or assembly of subcomponents. One suitable body assembly that may be adapted to benefit from the invention is described in U.S. patent application Ser. No. 11/332,781, filed Jan. 13, 2006. Other load lock chambers that may be adapted to benefit from the invention include U.S. patent application Ser. No. 10/832,795, filed Apr. 26, 2004, U.S. patent application Ser. No. 09/663,862, filed Sep. 15, 2000, U.S. patent application Ser. No. 10/842,079, filed May 10, 2004, and U.S. patent application Ser. No. 11/421,793, filed Jun. 2, 2006, among others. All of said U.S. Patent Applications are incorporated herein by reference in their entireties.

In one embodiment, the main assembly 140 includes a top plate 204 and a bottom plate 206 that sandwich a plurality of ring-shaped bodies 248. Interior plates 298 are disposed between the bodies 248. The plates 204, 206, 298 enclose internal volumes 220 defined inside each of the bodies 248. In the embodiment depicted in FIG. 2, the upper and lower internal volumes 220 are configured as substrate transfer cavities 208, 210, while the internal volume 220 bounded by the middle body 248 is configured as a heating cavity 212.

In the embodiment depicted in FIG. 2, the lamp assemblies 120 are shown disposed in the heating cavity 212. However, the lamp assemblies may be alternatively disposed in one of the other transfer cavities 208, 210 or in any combination of the cavities 208, 210, 212.

The top and bottom plates 204, 206 are sealingly coupled to the bodies 248 by a plurality of fasteners in a manner that permits relative movement between at least one of the top and bottom plates 204, 206 and the body 248. For example, at least one of the top and bottom plates 204, 206 are coupled to the body 248 without welding. In embodiments wherein force applied to the sidewalls from the plates 204, 206 is not of great concern, the top and bottom plates 204, 206 and the body 248 may be coupled by welding.

Figure 3:
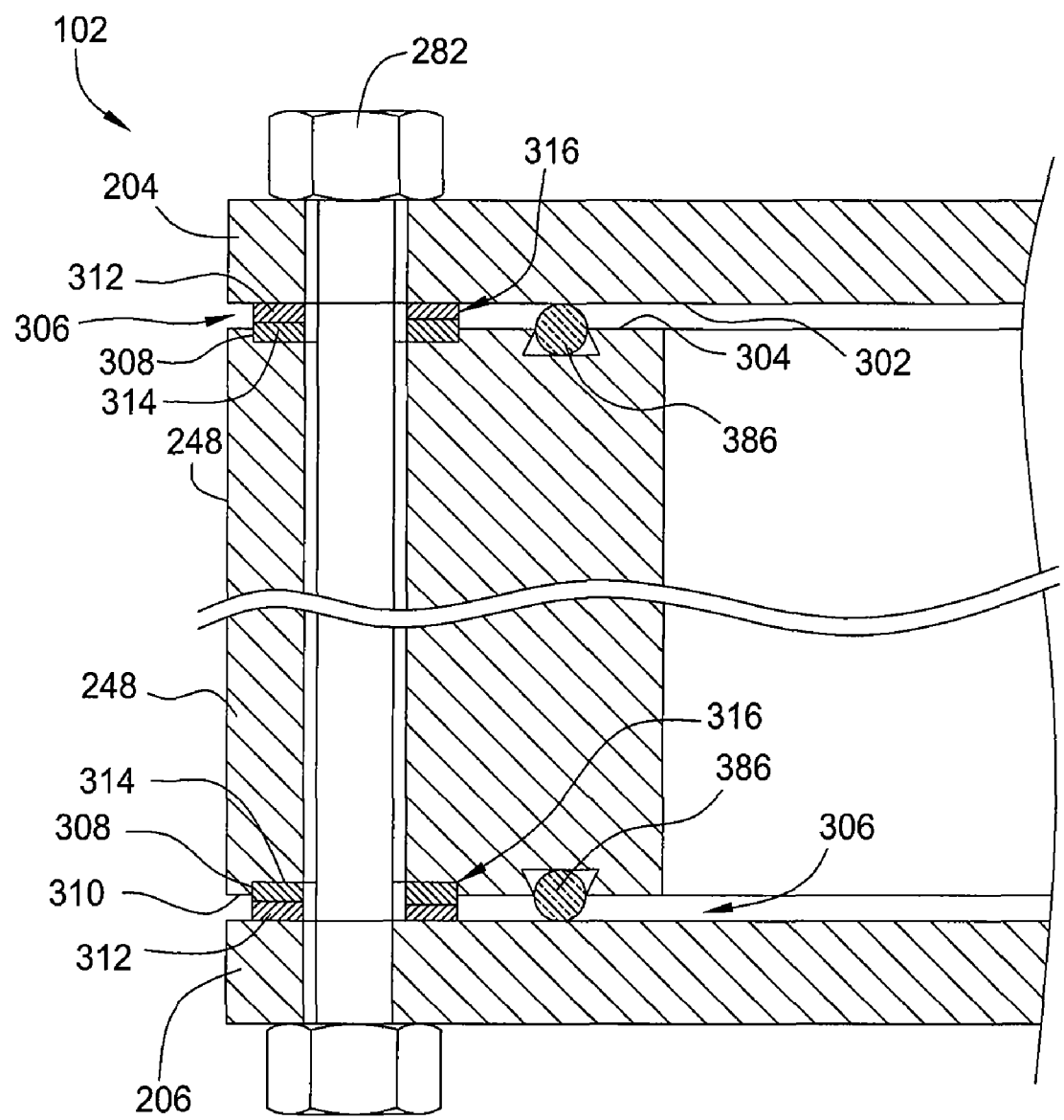
FIG. 3 is a partial sectional view of the load lock chamber of FIG. 1.

Referring additionally to a partial sectional view of the body assembly 160 depicted in FIG. 3, at least one spacer 316 is provided between a lower surface 302 of the top plate 204 and an upper surface 304 of the body 248. The spacer 316 separates the top plate 204 and chamber body 248, such that a gap 306 is defined therebetween. In one embodiment, the spacer 316 is a member having a plan area much smaller than the plan area of the upper surface 304 of the chamber body 248. For example, a plurality of spacers 316 may be disposed on upper surface 304 along one side of the chamber body 248.

The thickness of the spacer 316 is selected such that a gasket or o-ring 386 is adequately compressed to maintain a vacuum seal between the plates and body, while preventing the top plate 204 from contacting the chamber body 248 under vacuum or other stress conditions. Similarly, one or more spacers 316 are provided between the bottom plate 206 and the chamber body 248 to maintain a gap 306 therebetween.

In the embodiment depicted in FIG. 3, a first spacer 312 and a second spacer 314 are shown disposed between the top plate 204 and the chamber body 248. The spacers 312, 314 are fabricated from a material having a lower coefficient of friction between itself (i.e., spacer 312 to spacer 314) than a coefficient of friction between the spacer and the chamber body 248 and/or top plate 204. Thus, as the chamber body 248 and the top plate 204 move relative to each other due to vacuum, thermal or other forces, the top plate 204 and first spacer 312 are free to translate laterally across the second spacer 314 (and body 248) while preventing the top plate 204 and body 248 from touching.

In one embodiment, the spacers 312, 314 are disks. The disks may be washers disposed around the bolts 282 utilized to secure the body assembly 160 for ease of assembly. As the sliding components (e.g., the spacers 312, 314) have reduced contact area relative to the upper surface 304 of the body 248, the force necessary to begin motion is reduced. Additionally, as the contacting surface of the spacers 312, 314 are outward of the gasket 286, any particles generated during the sliding of the spacers 312, 314 are beneficially prevented from entering the internal volume 220 of the load lock chamber 104. It is contemplated that the spacers 316 may be in the form of a rib or other feature, extending between the plates and body to maintain a gap therebetween. It is also contemplated that the spacer may be incorporated into either the plates or body. It is contemplated that the spacers 316 may be in the form of a rib or other feature extending between the plates and body to maintain a gap therebetween. It is also contemplated that the spacer may be incorporated into either the plate or body (i.e., have unitary construction).

In the embodiment depicted in FIG. 3, a recess 308 is formed in the upper surface 304 of the body 248 to locate the second spacer 314. Optionally, a recess (not shown) may be formed in the top plate 204 to locate the first spacer 312. The recess (not shown) 308 has a depth selected, such that the spacer 314 extends beyond the upper surface 304 to ensure the first spacer 312 is free to slide laterally relative to the body 248.

Optionally, to further minimize the effect of forces exerted on the top plate 204 (and other horizontal plates) of the load lock chamber 104, at least one slot (not shown) may be formed therein. The slots allow the central region of the top plate 204 to move, deflect and/or expand while minimizing the effect of motion on the edges of the top plate. A seal assembly disposed in the slot to prevent leakage into interior volume of the load lock chamber 104. A load lock chamber having a slot for mitigating deflection is described in U.S. patent application Ser. No. 11/332,781, filed Jan. 13, 2006, and is incorporated by reference in its entirety.

Returning back to FIG. 2, two substrate access ports 216 are formed through opposing sidewalls of the bodies 248 to allow entry and egress of substrates from the internal volume 220 of the substrate transfer cavities 208, 210. Only one of the ports 216 are shown in FIG. 2. The heating cavity 212 includes at least one substrate access port 216 defined on a side of the body 248 that is coupled to the transfer chamber 106 so that the interior volume 220 of the transfer cavity 212 may be accessed by the vacuum robot 110 (shown in FIG. 1). The heating cavity 212 may optionally have a second substrate access port (not shown in FIG. 2) to allow substrate transfer between the heating cavity 212 and the factory interface 102. The second substrate access port may be selectively sealed by a slit valve door, or alternatively sealed by a blank plate since the substrate access port, in this configuration of the load lock assembly, is primarily used for cavity maintenance.

Figure 4:
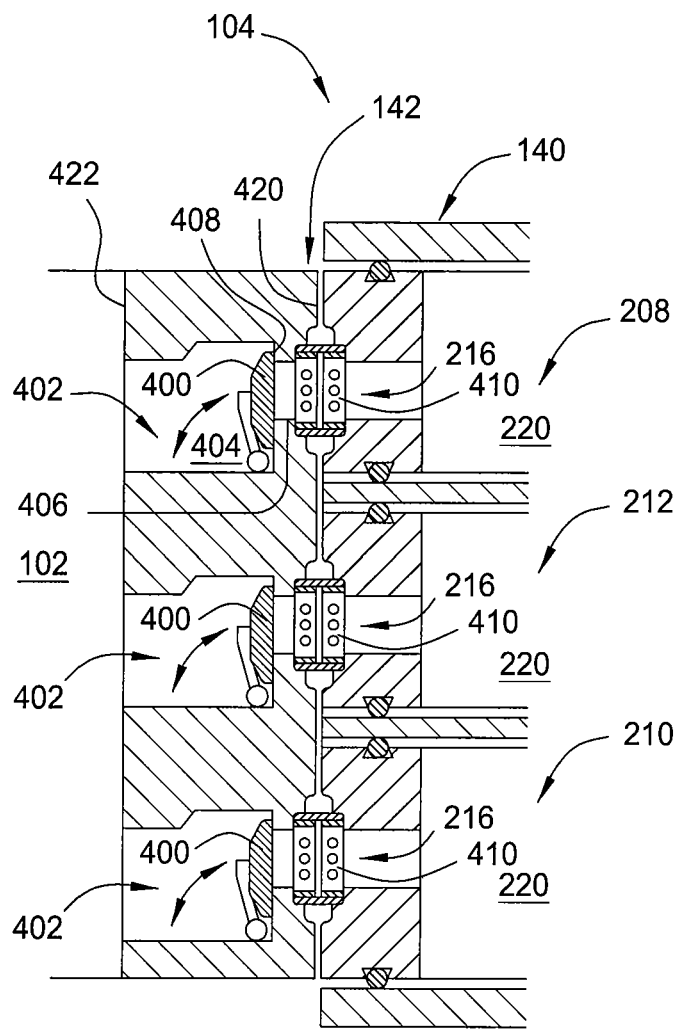
FIG. 4 is a simplified sectional view of the chamber body assembly illustrating the position of slit valve doors utilized to seal the factory interface from the load lock chamber.

FIG. 4 is a simplified sectional view of the chamber body assembly 106 illustrating the position of slit valve doors 400 utilized to seal the substrate access ports 216 on the factory interface side of the load lock chamber 104. The positioning of the slit valve doors 400 on the transfer chamber side of the load lock chamber 104 will be described further below with reference to FIG. 10. The slit valve doors 400 are housed in the slit valve seal compartments 142, 144. The slit valve doors 400 are utilized to provide a pressure barrier and selectively isolate the cavities of the body main assembly 140. In a closed position, the slit valve doors 400 prevent gas and substrate movement through the ports 216. In an open position, the slit valve doors 400 prevent flow through the substrate access ports, as is well known in the art. One slit valve door that may be adapted to benefit from the invention is described in U.S. patent application Ser. No. 10/867,100, entitled CURVED SLIT VALVE DOOR, filed Jun. 14, 2004 by Tanase, et al., and is incorporated by reference in its entirety.

In the embodiment depicted in FIG. 4, the seal compartment 142 generally includes a transfer passage 402 through which the substrate is transferred between the load lock chamber 104 and the factory interface 102. The transfer passage 402 has a substrate transfer port 406 and a door cavity 404. The substrate transfer port 406 exits the seal compartment 142 on a first side 420 of the seal compartment 142 and is generally aligned with the substrate access port 216 of the main assembly 140. The door cavity 404 exits the seal compartment 142 on a second side 420 of the seal compartment 142, where the cavity 404 is generally open to the factory interface 102. The door cavity 404 is generally sized to allow the door 400 to be rotated therein between an open position that allows clearance of the substrate (and robot) to be conveyed therethrough, and a closed position (as shown) that effectively seals the transfer passage 402.

A seal face 408 is defined in the transfer passage 402 between the door cavity 404 and the transfer port 406. The seal face 408 is shown in a vertical orientation in FIG. 4, but may be inclined from vertical to reduce the travel of the actuator (not shown) which operates the door 400.

A seal assembly 410 is deposed between the seal compartment 142 and the main assembly 140. The seal assembly 410 provides a vacuum tight seal between the seal compartment 142 and the main assembly 140, and circumscribes the port 216, 406.

Figure 5:
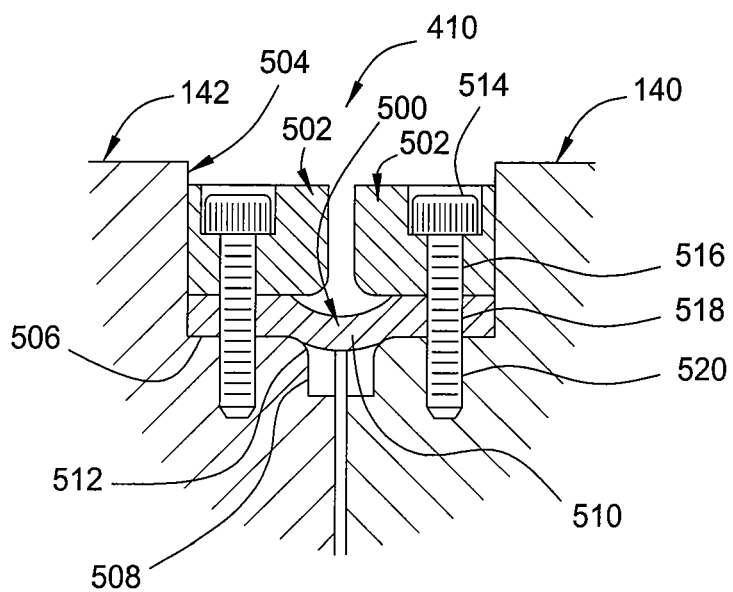
FIG. 5 is a sectional view of one embodiment of a seal assembly.

FIG. 5 is a sectional view of one embodiment of the seal assembly 410. The seal assembly 410 generally includes a seal ring 500 and a plurality of clamp blocks 502 that fits into a recess 504 defined at the edges of the main assembly 140 and the seal compartment 142. The seal ring 500 may be fabricated from a polymer, such as VITON, or other gasket material suitable for use under vacuum conditions. Alternatively, the seal ring 500 may be a metallized bellows.

The clamp blocks 502 are arranged in two spaced apart annular rings, each clamp block ring for sealing an opposite edge of the seal ring 500. The clamp blocks 502 are generally fabricated from a stiff material, such as a metal, ceramic or polymer. The material of the clamp blocks 502 is generally selected to be sufficiently stiff enough to compress the ring 500 as discussed below.

Fasteners 514 generally pass through holes 516, 518 formed through the clamp blocks 502 and seal ring 500 and engage threaded holes 520 respectively formed in the seal compartment 142 and the main assembly 140. As the fasteners 514 are tightened, each clamp block 502 respectively compresses opposite edges of the seal ring 500 against the seal compartment 142 and the main assembly 140, forming a seal therebetween. Since the seal compartment 142 and the main assembly 140 remain separated, i.e., a gap is defined therebetween, motion and/or deflection of the main assembly 140 is not transferred to the seal compartment 142 because of the flexibility of the seal ring 500. Thus, as the seal assembly 410 accommodates substantially all of the motion and/or deflection of the main assembly 140 without any other rigid fastener or other rigid element fixing the main assembly 140 to the seal compartment 142, the motion and/or deflection of the main assembly 140 is decoupled from the seal compartment 142, thereby maintaining the orientation of the door assembly 400 and seal face 408 for a robust and reliable seal, and substantially eliminating sliding seal face-to-door motion for long seal life and reduced particle generation.

Figure 6:
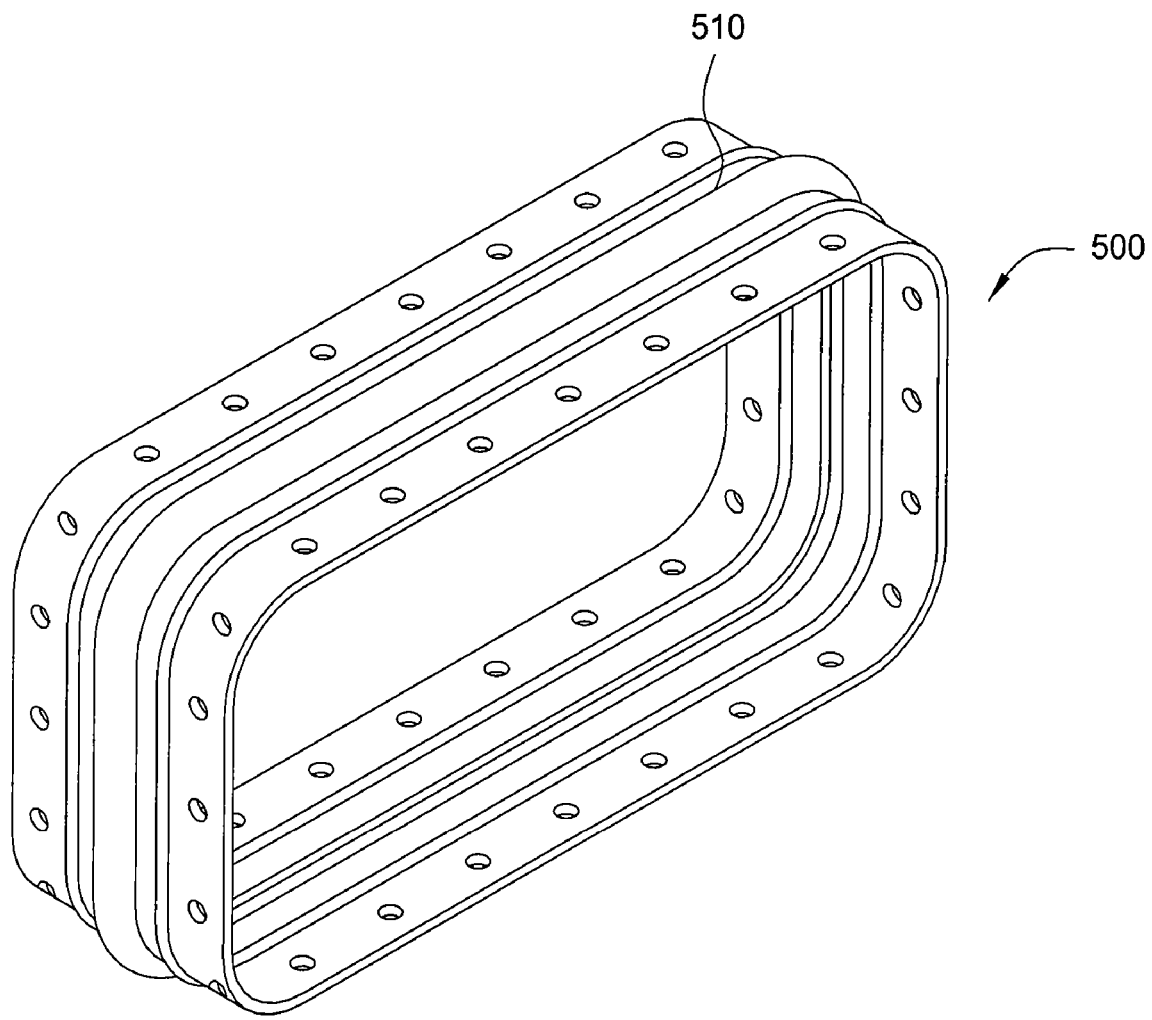
FIG. 6 is a sectional view of one embodiment of a seal ring.
Figure 7:
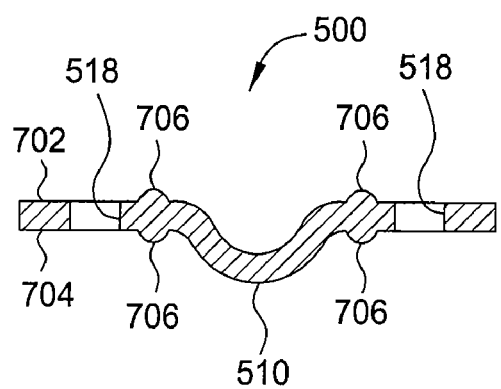
FIG. 7 is a perspective view of one embodiment of a seal ring.
Figure 9A:
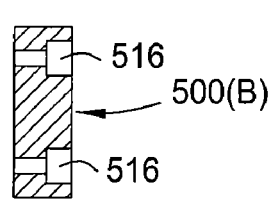
FIGS. 9A-B are top and sectional views of another segment of a clamp block.
Figure 9B:
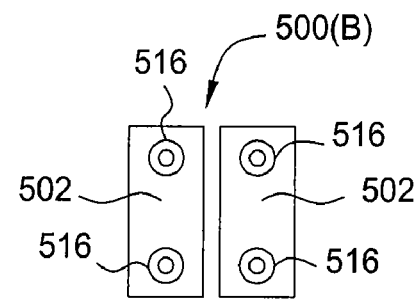
Figure 8A:
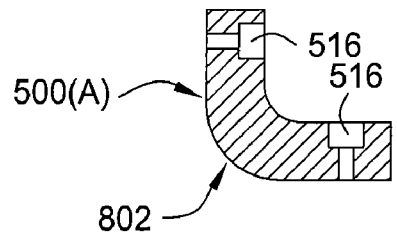
FIGS. 8A-B are top and sectional views of a segment of a clamp block.
Figure 8B:
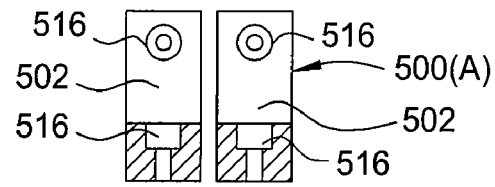

Referring additionally to FIGS. 6-7, the seal ring 500 is generally an annular ring, shaped to fit against the walls defining the ports 216, 406. In the embodiment depicted in FIG. 7, the seal ring 500 has a generally rectangular form, although other geometric shapes suitable for circumscribing the ports may be utilized. The seal ring 500 has an inner first side 702 and an outer second side 704 which define a flat ribbon having a tubular form. The seal ring 500 includes a wave 510 that projects from the second side 704. The recess 504, which is defined in a portion of the main assembly 140 and plate 142, includes a bottom 506 against which the ring 500 is sealingly clamped. A trough 508 is defined in the bottom 506 of the recess 504 to accommodate the wave 510. An interface 512 between the sidewalls of the trough 508 and the bottom 506 may be rounded to prevent damage to the ring 500. Likewise, the inner bottom corner of the clamp blocks 502 are also rounded to prevent the seal ring 500 form being pulled against a sharp corner when exposed to vacuum. As the first side 420 of the ring 500 is brought under vacuum, the wave 510 may flatten against the clamp block 502 to support the seal. Since the holes 518 in the seal ring 500 are exposed to the vacuum environment, ridges 706 are provided on the first and second sides 420, 422 of the ring 500 inward of the holes 518 to concentrate contact pressure between the ring 500 and the respective surfaces of the clamp blocks 502 and bottom 506 of the recess 504 to enhance maintenance of vacuum integrity.

The clamp blocks 502 may be fabricated from metal or other suitable material. The clamp blocks 502 may be annular in form and slightly flexible to allow clamping of the ring 510. In other embodiments, the clamp blocks 502 may be fabricated from a plurality of clamp segments for ease of assembly.

For example, in the embodiment depicted in FIGS. 8A-B and 9A-B, the pair of clamp blocks may comprise clamp segments. The clamp segments may be arranged in pairs as shown, or staggered. The clamp segments may be fastened adjacent each other to substantially cover the interior first side 702 of the ring 500. The clamp segments include segments of any size and shape that may be arranged to substantially cover the inner first side 702 of the ring. In the embodiment depicted in FIGS. 8A-B and 9A-B, the clamp block 502 includes a plurality of corner segments 500(A) and a plurality of straight segments 500(B). As shown in the sectional view of FIG. 8A and the top view of FIG. 8B, the corner segments 500(A) have a bend 802 that substantially matches the corner of the recess 504 as the recess 504 curves or turns to follow the circumference of the ports 216, 406. A shown in the sectional view of FIG. 9A and the top view of FIG. 9B, the straight segments 500(B) are sized to cover the ring 500 along the straight or linear portions of the recess 504, either as a single straight segment 500(B), or as a plurality of abutted straight segments 500(B). It is contemplated that the clamp block 502 may have other configurations.

Figure 10:
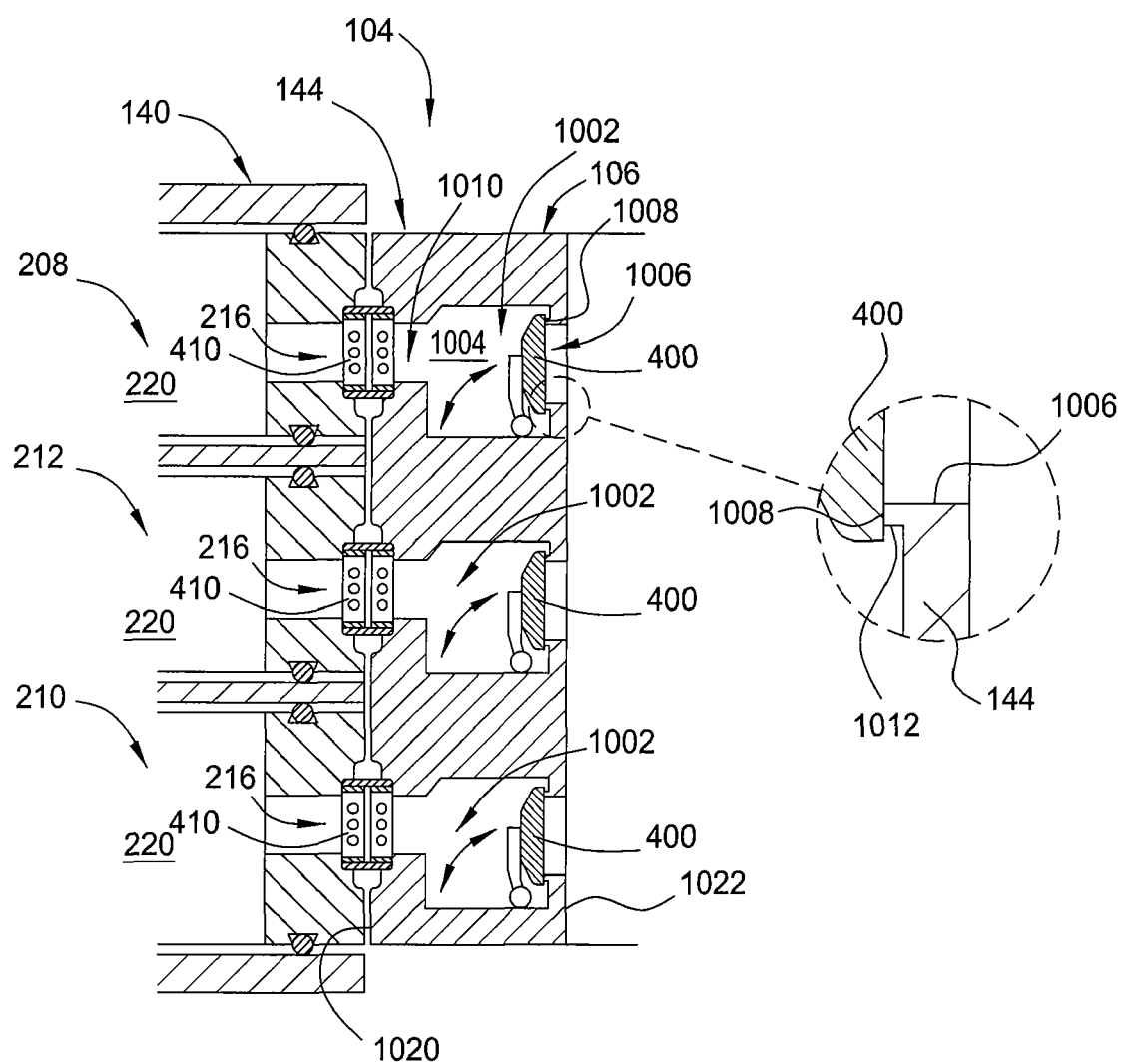
FIG. 10 is a simplified sectional view of the chamber body assembly illustrating the position of slit valve doors utilized to seal the transfer chamber from the load lock chamber.

FIG. 10 is a simplified sectional view of the chamber body assembly 106 illustrating the position of slit valve doors 400 housed in the seal compartment 144 and utilized to seal the substrate access ports 216 on the transfer chamber side of the load lock chamber 104. The seal compartment 144 generally includes a transfer passage 1002 through which the substrate is transferred between the load lock chamber 104 and the transfer chamber 106. The transfer passage 1002 has a substrate transfer port 1006, a substrate transfer aperture 1010 and a door cavity 1004. The substrate aperture 1010 exits the seal compartment 144 on a first side 1020 of the seal compartment 144 and is generally aligned with the substrate access port 216 of the main assembly 140. The substrate transfer port 1006 exits the seal compartment 144 on a second side 1022 of the seal compartment 144 and is generally open to the transfer chamber 106. The door cavity 1004 is defined between the port 1006 and aperture 1010. The door cavity 1004 is generally sized to allow the door 1000 to be rotated therein between an open position that allows clearance of the substrate (and robot) to be conveyed therethrough, and a closed position (as shown) that effectively seals the transfer passage 1002.

A seal face 1008 is defined in the transfer passage 1002 between the door cavity 1004 and the transfer port 1006. The seal face 1008 is shown in a vertical orientation in FIG. 10, but may be inclined from vertical to reduce the travel of the actuator (not shown) which operates the door 1000. A lip 1012 may extend circumferentially from the seal face 1008 to increase the unit loading on the door 400.

A seal assembly 410 is disposed between the seal compartment 144 and the main assembly 140. The seal assembly 410 provides a vacuum tight seal between the seal compartment 144 and the main assembly 140, and circumscribes the port 216, 1006, and is configured as described with reference to FIGS. 5-9 above. The seal assembly 410 has a flexible member coupling the seal compartment 144 to the main assembly 140. Therefore, as no rigid members, such as metal fastening means, fasteners, welds, and the like, directly couple the seal compartment 144 to the main assembly 140, motion and/or forces acting on the main assembly 140 are isolated from the seal compartment 144. This improves seal longevity and reliability, along with reducing particulate generation due to seal rubbing/wear.

Returning back to FIG. 2, at least one of the plates 204, 206, 298 may be configured as a temperature regulating plate. One or more passages 224 may be formed in the plates 204, 206, 298 and coupled to a fluid source 228. The fluid source 228 provides a heat transfer fluid that is circulated through the passages 224 to regulate (i.e., heat and/or cool) the temperature of the plates 204, 206, 298 and ultimately, the temperature of the substrate 116. By cooling the plates 204, 206, 298, hot substrates returning from processing may be effectively cooled without utilizing a separate conventional cooling plate disposed within the cavities 208, 210.

The heating cavity 212 generally includes one or more lamp assemblies 120 disposed through the internal volume 220 that are selectively utilized to heat the substrate 116. In the sectional view depicted in FIG. 2, one lamp assembly 220 is shown extending between the side walls of the body assembly 160. Each lamp assembly 120 may be coupled to the power source 122 such that each lamp assembly disposed in the internal volume 120 may be independently controlled, thereby allowing the temperature profile of the substrate 116 to be tailored as desired, for example, by uniformly heating and/or by heating one region of the substrate faster than a second region. In one embodiment, the lamp assemblies 120 are arranged and/or controlled such that the center of the substrate 116 is heated at a rate different than the perimeter of the substrate.

Figure 11A:
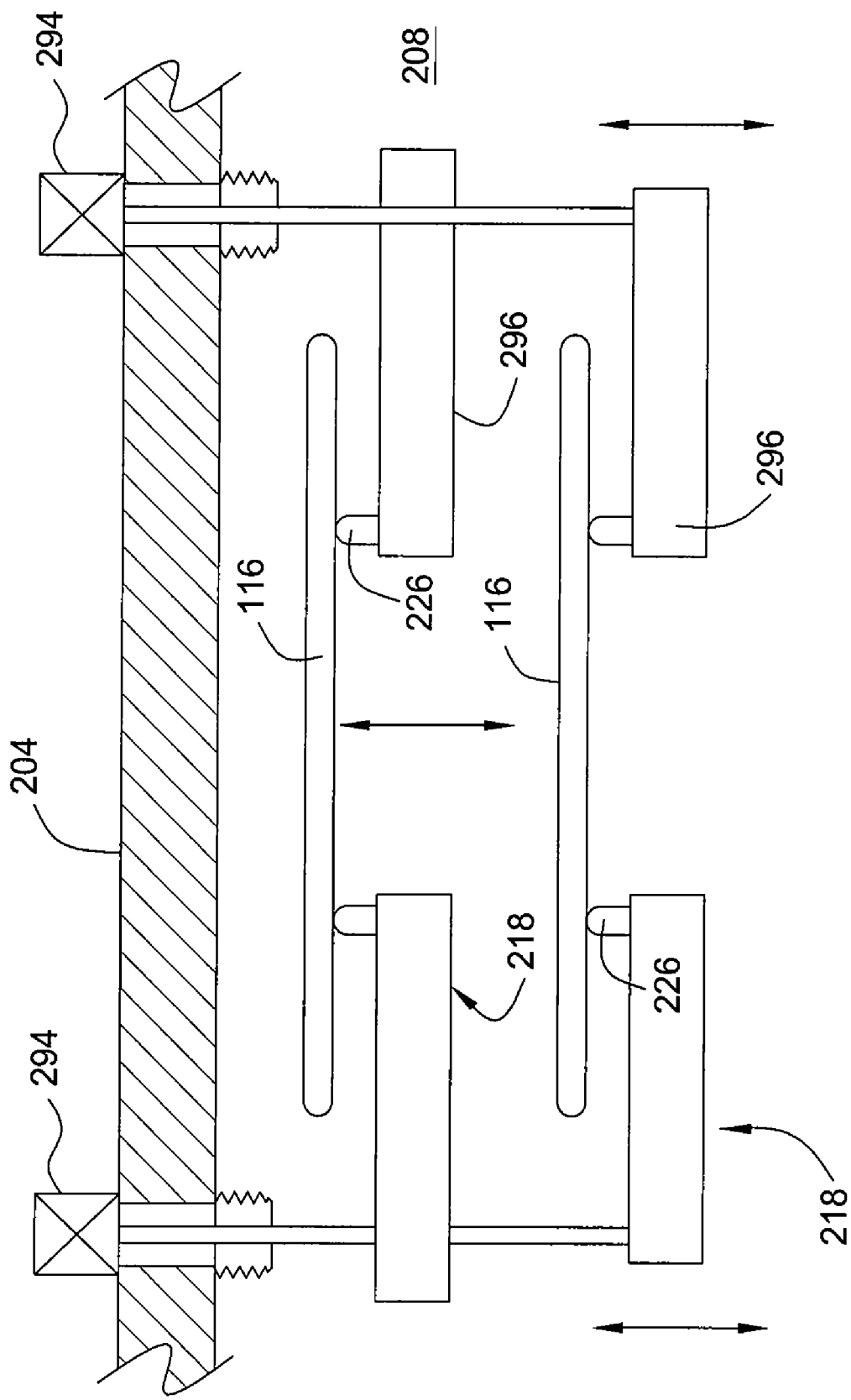
FIG. 11A is another partial sectional view of the load lock chamber of FIG. 1.
Figure 11B:
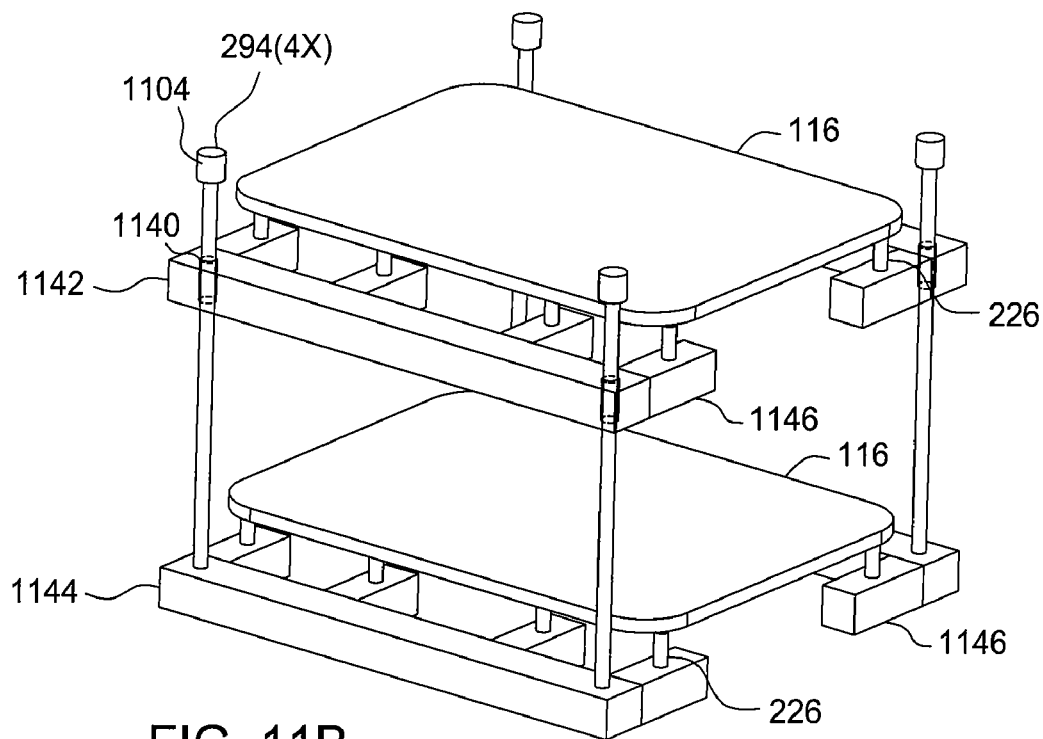
FIG. 11B is a partial isometric view of another embodiment of an interior of a load lock chamber.

Referring to FIGS. 2 and 11A-B, a substrate support structure 218 is disposed in the internal volumes 220 of the transfer cavities 208, 210. The substrate support structure 218 is generally configured to support two substrates in a stacked orientation. The elevation of the support structures 218 is controlled such that the proximity of substrate to the cooled plates (or lamp assembly 120) may be adjusted. The elevation of the support structure 218 may also be controlled to facilitate substrate exchange through the ports 216. In one embodiment, each substrate support 218 is coupled to one or more actuators 294 so that the elevation of the substrate supports 218 within each cavity may be independently controlled. It is contemplated that other substrate support structures may alternatively be used. It is also contemplated that the elevation of the support structures may be synchronized between cavities using one or more actuators.

In one embodiment, the substrate support structure 218 includes a plate or plurality of bars 296 coupled to the actuators 294. The bars 296 are configured to span under of the substrate supported thereon to facilitate coupling of the bar to the actuator 294.

One or more pins 226 may extend from each the bars 296 to support the substrate 116 thereon. The ends of the pins 226 supporting the substrate 116 may be rounded and/or include a ball to reduce dynamic friction between the bottom surface of the substrate 116 and the pins 226 and to prevent substrate scratching. In the embodiment depicted in FIG. 2, a ball is disposed at a distal end of each pin 226. The reduced friction provided by the balls allows the substrate to readily expand and contract while supported on the pins 226 without scratching the substrate. Other suitable substrate supports are described in U.S. Pat. No. 6,528,767, filed Mar. 5, 2003; U.S. patent application Ser. No. 09/982,406, filed Oct. 27, 2001; and U.S. Patent Application No. 60/376,857, filed Feb. 27, 2003, all of which are incorporated by reference in their entireties. The pins 226 are generally arranged to facilitate substrate exchange with a robotic end effector. Pins 226 are additionally coupled to the interior plate 298 forming the floor of the heating cavity 212 to support a substrate therein.

To enhance heat transfer between the substrate and the chamber body 248, the substrate supports 218 may move the substrate support thereon proximate the floor (or ceiling) of the transfer cavities 208, 210. The distance between the substrate and transfer cavity floor/ceiling may be adjusted based on the temperature of the substrate. For example, hot substrate returning from pressing may have temperatures in excess of 240 degrees Celsius. To prevent condensation and/or thermal stress from forming, the hot substrate may be maintained at a large distance from the transfer cavity floor/ceiling. Once the hot substrate has been sufficiently cooled, for example to about 140 degrees Celsius, the cooler substrate may be moved closer to the transfer cavity floor/ceiling to increase the heat transfer efficiency, thereby allowing cooler substrate temperatures to be obtained at a faster rate, which also enhances substrate throughout.

To further enhance heat transfer between the substrate and the floor/ceiling of the transfer cavities 208, 210, the substrate supports 218 may be configured to interfit with the floor and/or ceiling of the transfer cavity. This allows the distance between the substrate and chamber body assembly 160 to be minimized, and in some embodiments, to place the substrate in contact with the chamber body assembly 160 to take full advantage of thermal exchange with the heat transfer fluid running through the passages 224.

Figure 12:
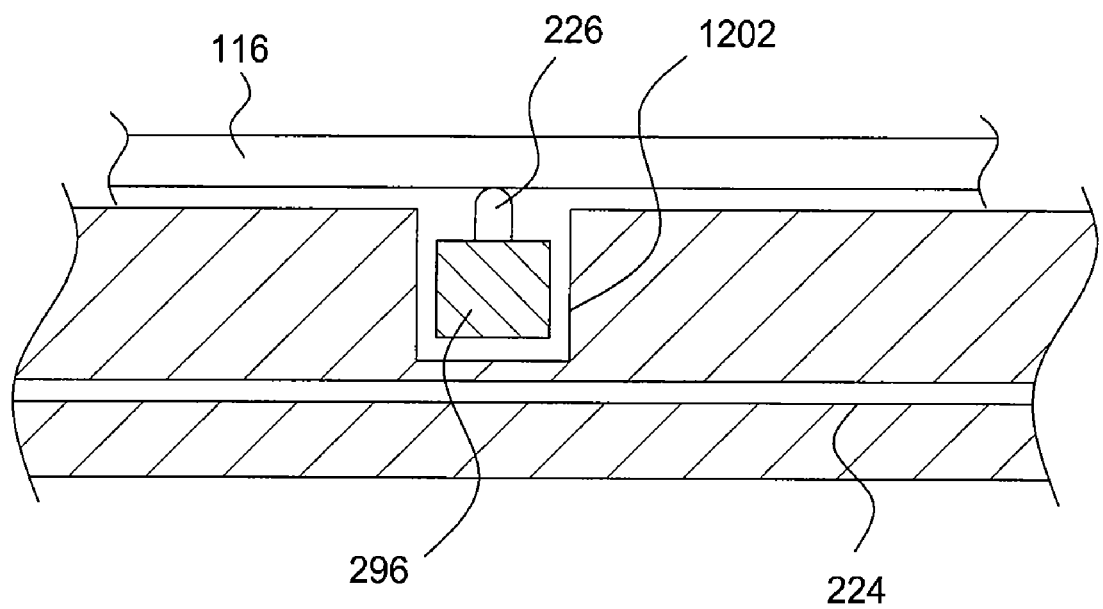
FIG. 12 is another partial sectional view of the load lock chamber of FIG. 1.

FIG. 12 depicts a sectional view of one embodiment of the interior plate 298 configured to interfit with the substrate support 218. The plate 298 includes slots 1202 (one is shown in FIG. 12) that are configured to allow the bar 296 of the substrate support 218 to be moved therein. In one embodiment, the depth of the slot 1202 may be selected to allow the substrate to be lifted from the pins 226 by the plate 298 as the bar 296 moves to the bottom of the slot 1202. Alternatively, the slot 1202, or motion of the bar 296, may be configured to maintain the substrate 116, supported on the pins 226, in close proximately to the plate such that the substrate is efficiently cooled by the fluid circulating through the passages 224. The second transfer cavity 210 is similarly configured with slots 1202 formed in the lower portion of the bounding internal plate 298.

Figure 11C:
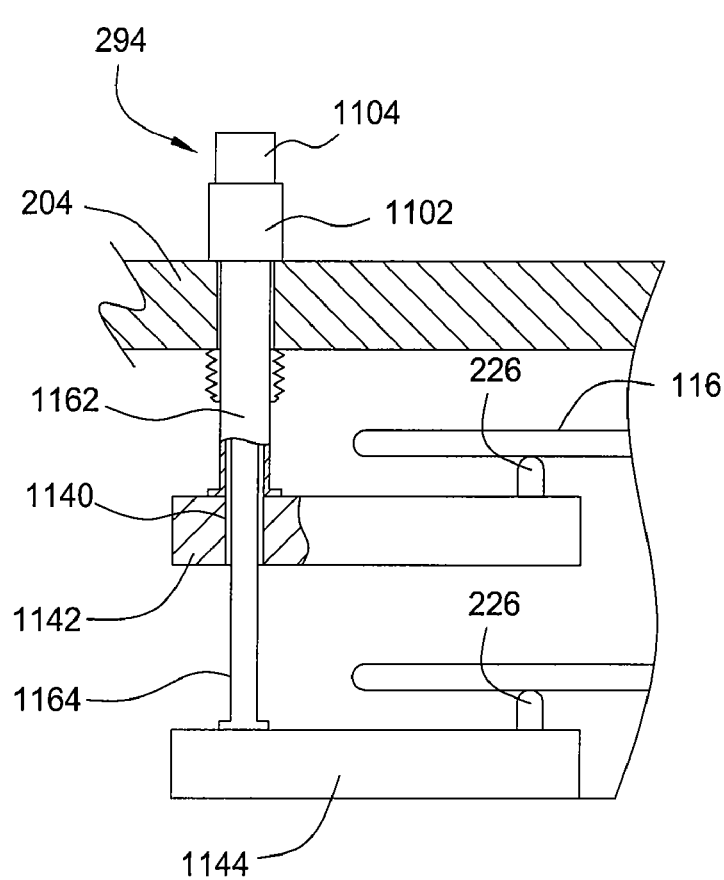
FIG. 11C is a partial sectional view of another embodiment of an interior of a load lock chamber.

FIG. 11C is a partial isometric view of another embodiment of an interior of the load lock chamber. In the embodiment depicted in FIG. 11C, a first actuator 1104 controls the elevation of the lower substrate support 1144, and a second actuator 1102 controls the elevation of the upper substrate support 1142, thereby allowing independent control of the elevation of separate substrates in a single cavity. The first actuator 1104 passes through a feature 1140 formed in the upper substrate support 1142, thereby enabling the actuators 1102, 1106 to be aligned. Thus, the substrate supports 1142, 1144 may be configured to have the same projected surface area (e.g., footprint) within the interior volume of the load lock chamber, thereby enabling the walls of the load lock chamber body to be disposed closer to the substrate supports 1142, 1144, which reduces the interior volume of the load lock chamber beneficially resulting in lower pumping and venting times. In the embodiment, the feature 1140 may be a hole formed through the upper substrate support 1142. It is contemplated that the feature 1140 may alternatively be a notch, a groove, a slot, cut-out or other geometric disparity between the upper and lower substrate supports 1142, 1144 which enable the actuator 1140 controlling the elevation of the lower substrate support 1144 to be coupled to the lower support plate 1144 without obstruction by upper substrate support 1142. It is also contemplated that pairs of the actuators 1102, 1104 may be concentrically aligned, with the actuation rod 1164 of the lower actuator telescoping through the rod 1162 of the upper actuator 1102 and the feature 1140 of the upper substrate support 1142, as shown in FIG. 11C.

Returning again to FIG. 2, a pressure control system 250 is coupled to the load lock chamber 104 to control the pressure within the internal volumes 220 of the body assembly 160. The pressure control system 250 generally includes a gas source 252 and an exhaust system 254. The gas source 252 is coupled to at least one inlet port 260 formed through the chamber body assembly 160. The gas source 252 provides a vent gas utilized to raise and/or regulate pressure within the internal volume 220 of the chamber body assembly 160. For example, the gas source 252 may flow vent gas into the internal volumes 220 of the transfer cavities 208, 210 to facilitate transfer of the substrate 116 from a vacuum environment to an ambient environment. In one embodiment, the vent gas comprises at least one of nitrogen, helium, air or other suitable gas. Optionally, the heating cavity 212 may not include an inlet port as, in one embodiment, the cavity 212 may be constantly maintained at operational vacuum pressure.

An inlet control valve 256 is disposed between the gas source 252 and the inlet port 260 to selectively control the flow of vent gases into the internal volumes 220 of the body assembly 160. The inlet control valve 256 is capable of providing a substantially leak-tight seal under vacuum conditions. In one embodiment, the gas source 252 is configured to control the attributes of the vent gas, such as the flow rate, temperature and/or humidity of the vent gas.

In the embodiment depicted in FIG. 2, the inlet port 260 is coupled to one or more diffusers 240 by a vent passage 238. The diffusers 240 are formed in an interior side of the top plate 204 (or other plate), such that gas flowing into the internal volume 220 is directed toward the top of the substrate 116. This arrangement beneficially assists in cooling the substrate 116 while venting the load lock chamber 104 after processing the substrate 116.

In one embodiment, the diffuser 240 is formed in a recess 232 defined in the bottom surface of the plates 204, 298. A cap 244 covers the recess 232 to define a plenum 242 in the plates. A connecting hole 236 fluidly couples the plenum 242 to the vent passage 238. A plurality of apertures 276 are formed through the cap 244 to allow vent gases to flow from the gas source 252 through plenum 242 and into the interior volume 220, as illustrated by arrows 234. Although the diffusers 240 are primarily intended to direct venting gases into the load lock chamber 104, it is contemplated that the diffusers 240 may also be utilized to evacuate the internal volume 220 of the chamber 104.

The exhaust system 254 is generally coupled to at least one exhaust port 262 formed through the chamber body assembly 160. The exhaust system 254 is configured to remove gases from the internal volume 220 of the load lock chamber 104. The exhaust system 254 may include one or more vacuum pumps (not shown) and may be ultimately coupled to the facilities exhaust system (also not shown). For example, the exhaust system 254 may pump out gas from the internal volume 220 to facilitate transfer of the substrate 116 from an ambient environment to a vacuum environment.

An exhaust control valve 258 is disposed between the exhaust system 254 and the exhaust port 262 to selectively control the flow of gases exiting the internal volume 220 of the body assembly 160. The exhaust control valve 258 is typically similar to the inlet control valve 256 and is capable of providing a substantially leak-tight seal under vacuum conditions.

A controller 280 is coupled to the load lock chamber 104 to control the operation thereof. The controller 280 includes a central processing unit (CPU) 282, support circuits 286 and memory 284. The CPU 282 may be one of any form of computer processor that can be used in an industrial setting for controlling various chambers and subprocessors. The support circuits 286 are coupled to the CPU 282 for supporting the processor in a conventional manner. These circuits include cache, power supplies, clock circuits, input/output circuitry, subsystems, and the like. The memory 284 is coupled to the CPU 112. The memory 284, or computer-readable medium, may be one or more of readily available memory such as random access memory (RAM), read only memory (ROM), floppy disk, hard disk, or any other form of digital storage, local or remote.

Figure 13:
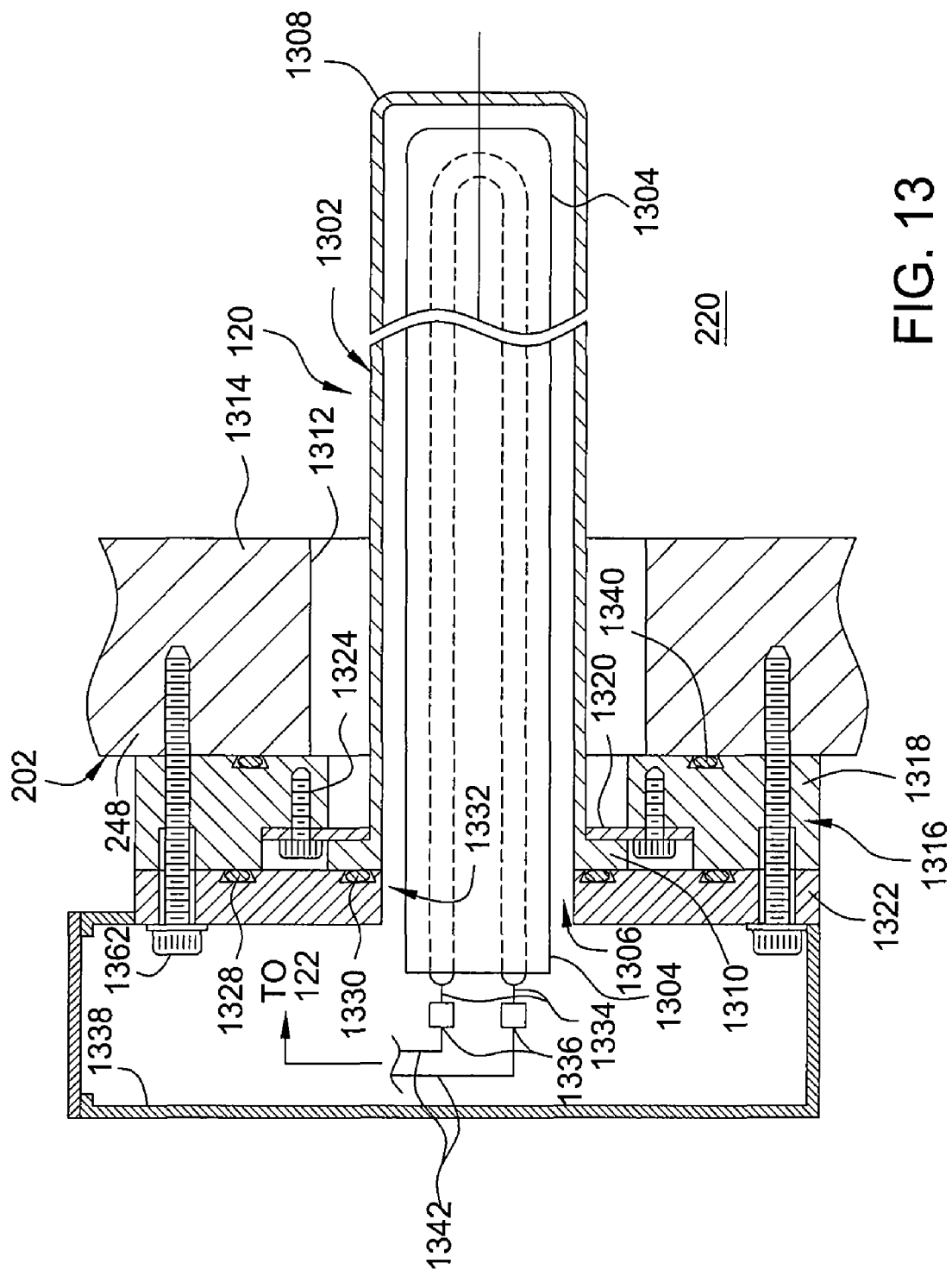
FIG. 13 is a partial sectional view of the load lock chamber of FIG. 1 illustrating one embodiment of a lamp assembly.

FIG. 13 is a partial sectional view of the load lock chamber 104 illustrating one embodiment of the lamp assembly 120. The lamp assembly 120 generally includes a tube 1302 housing a lamp 104. The lamp 104 may be a carbon IR lamp or other lamp suitable for radiantly heating the substrate disposed in the internal volume 220.

The upper surface of the lamp 1304 and/or tube 1302 may be coated with a reflective material so that the energy generated by the lamp 1304 is directed downward to the substrate to increase heating efficiency. In one embodiment, the coating comprises gold.

The tube 1302 is generally fabricated from a transmissive material suitable to allow radiant heat generated by the lamp 1304 to effectively heat the substrate 116 disposed in the internal volume 220 of the body assembly 160. In one embodiment, the tube 1302 is fabricated from quartz. The diameter and thickness of the tube 1302 is generally selected to prevent collapse due to the pressure differential experiences when the tube 1302 is surrounded by vacuum conditions.

The tube 1302 generally includes an open end 1306 and a closed end 1308. The tube 1302 is disposed through an aperture 1312 formed through a sidewall 1314 of the body 248. The tube 1302 includes a flared flange 1310 defined at the open end 1306. The closed end 1308 generally extends into the interior volume 202 defined in the body assembly 160.

The tube 1302 is coupled to the body assembly 160 by a mounting assembly 1316. The mounting assembly 1318 generally includes a mounting block 1318, a retainer 1320 and a cap 1322. The mounting assembly 1316 generally includes an aperture 1332 through which the closed end 1308 of the tube 1302 extends.

The retainer 1320 is generally annular in form and is coupled to the mounting block 1318 by a plurality of fasteners 1324. The inside diameter of the retainer 1320 is generally less than an outside diameter of the flange 1310 of the tube 1302. This prevents the open end 1306 of the tube 1302 from passing through the aperture 1332 and into the interior volume 220 of the body assembly 160.

The cap 1322 is coupled to the mounting block 1318 by a plurality of fasteners 1326. The cap 1322 captures the flange 1310 of the tube 206 against the retainer 1320. A first seal 1328 is disposed between the cap 1322 and the mounting block 1318. A second seal 1330 is disposed between the cap 1322 and the flange 1310 of the tube 1302. A third seal 1340 is disposed between the mounting block 1318 and the body 248. As the fasteners 1326 compress the cap 1322 to the mounting block 1318 and the mounting block 1318 to the body 248, the seals 1328, 1330, 1340 are compressed to provide a vacuum seal, thereby isolating the interior volume 220 from the exterior of the body assembly 160. Moreover, the second seal 1330 disposed between the tube 1302 and the mounting assembly 1316 fluidly isolates the interior of the tube 1302 from the interior volume of the body assembly 160.

Since the lamp assembly 120 is supported primarily from the walls of the body assembly 160 that have less area than the top or bottom, movement of the lamp assembly 120 due to pressure changes and/or body deflection is minimized. Moreover, spacing between the substrate and lamp assembly 120 is maintained at a substantially uniform distances The open end 206 of the tube 1302 is exposed to the atmosphere outside of the chamber body 202, thereby allowing the lamp 204 to be inserted and/or replaced from the tube 1302 without exposing the interior volume 220 of the load lock chamber to the ambient environment. Additionally, the lamp 1304 includes leads 1334 which may be coupled by a connector 1336 and wires 1342 outside of the interior volume 220 (e.g., at ambient pressures), thereby diminishing the probability of arcing and associated particle generations. Moreover, any particles associated with the lamp or the lamps electrical connections are fluidly isolated from the substrate, thereby eliminating the chance of particle contamination from these sources.

The wires 1342 may be routed through a chase 1338 or other wire conduit disposed outside the chamber body 202. The chase 1338 allows multiple lamp assemblies 120 extending into the interior volume 220 to be serviced from a single location.

Figure 14:
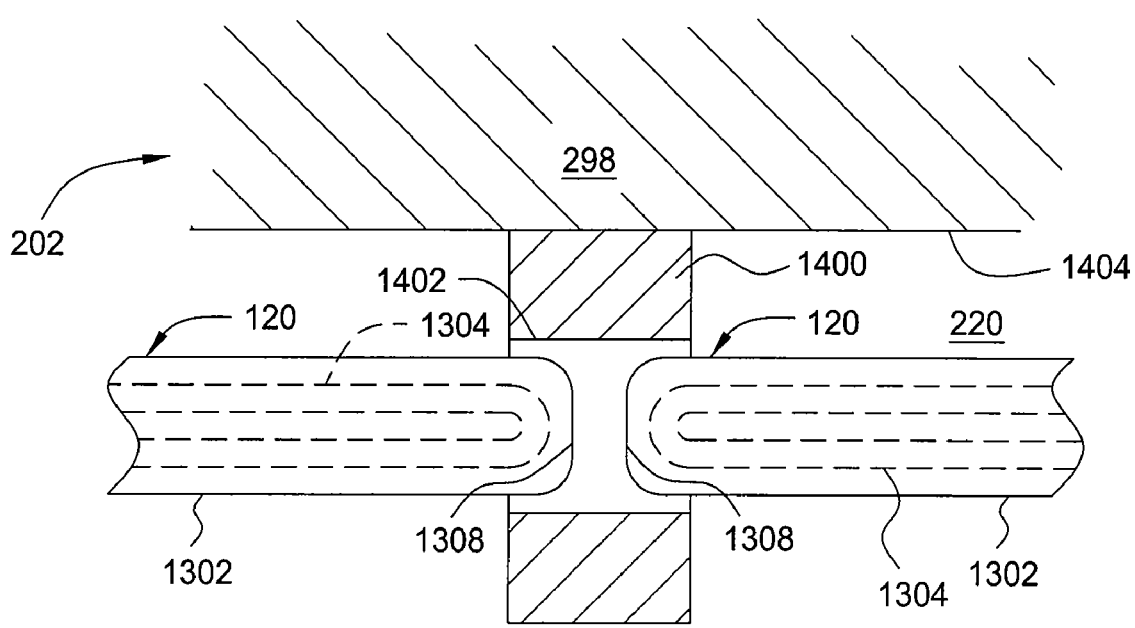
FIGS. 14-15 are a partial sectional view of a closed end of the lamp assembly supported in a load lock chamber.
Figure 15:
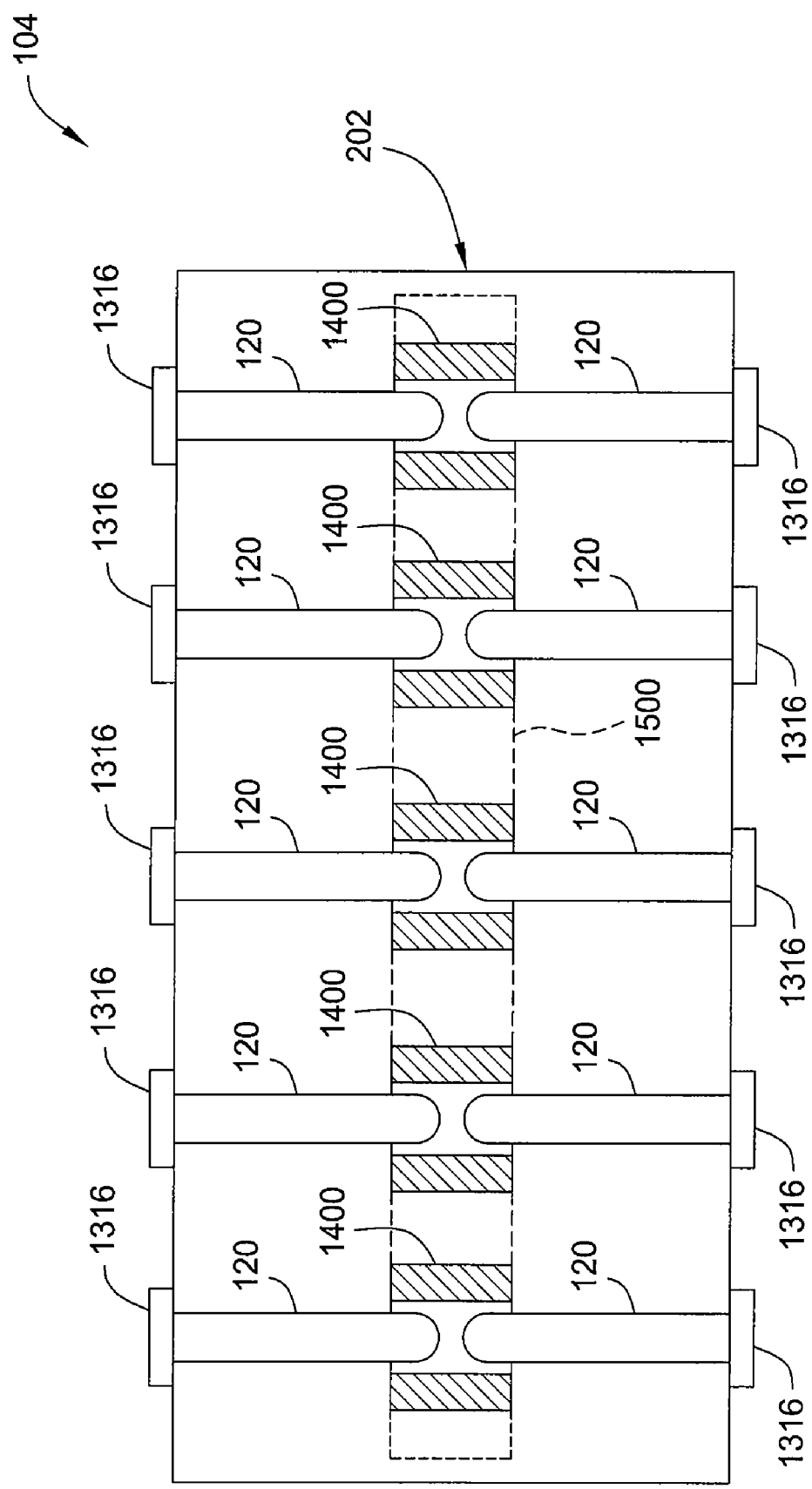

FIGS. 14-15 are partial sectional view of the closed end 1308 of the lamp assembly 120 supported within the chamber body 202. In the embodiment depicted in FIGS. 14-15, multiple pairs of lamp assemblies 120 are arranged in rows. Each lamp assembly 120 defining a pair extends through apertures (612) formed through facing sidewalls 1314 of the load lock chamber 104. Each pair of lamp assemblies 120 have their closed ends 1308 supported by a guide 1400. As shown in phantom line in FIG. 15, the guides 1400 may be in the form of a singular bar 1500. The opposing lamp assembly configuration that spans the interior volume of the chamber body shorter lamps 1304 to be used in the tube 1302. The shorter lamps 1304 (i.e., less than an interior chamber width) requires less clearance during lamp replacement. The short lamp feature is advantageous due to the close proximity of the processing chambers 108 adjacent the sidewalls of the load lock chamber 104, as shown in FIG. 1.

In the embodiment depicted in FIG. 14, the closed ends 1308 of the tubes 1302 are supported by a guide 1400. The guide 1400 includes a hole 1402 which receives the closed ends 1308 of the tube 1302. It is contemplated that dedicated guides may be used for each tube 1302. In one embodiment, the hole 1402 has sufficient clearance with the tube 1302 to ensure the lamp assembly 120 is supported in a cantilevered orientation from the sidewalls, thereby enhancing uniform lamp-to-substrate spacing uniformity.

The guide 1400 is generally coupled to a ceiling 1404 of the internal volume 220. The guide 1400 holds the lamp assembly 120 in a space apart relation with the ceiling 1404. In the embodiment depicted in FIG. 14, the ceiling 1404 is the underside of the interior plate 298. In other embodiments, the guide may be coupled to the bottom of the top plate 204, a bottom plate 206, or other portion of the body assembly 160.

Thus, a heated load lock chamber has been provided. The end supported lamp assembly decouples the position of the lamp from deflection experienced by the top of the chamber body when under vacuum conditions, thereby minimizing changes in the distance between the lamp and substrate during venting and vacuum cycles. Moreover, as the electrical connections of the lamps are positioned outside of the vacuum environment, arcing within the vacuum environment is eliminated. Furthermore, the opposing tube design facilitates lamp replacement without breaking vacuum even with adjacent chambers disposed in close proximity to the load lock chamber.

While the foregoing is directed to the preferred embodiment of the present invention, other and further embodiments of the invention may be devised without departing from the basic scope thereof. The scope of the invention is determined by the claims which follow.

What is claimed is:

1. A load lock chamber, comprising:
a main assembly having a substrate transfer cavity and two substrate access ports formed through the main assembly, the two substrate access ports fluidly coupled to the cavity;
a first slit valve door seal compartment having an aperture adjacent and aligned with one of the access ports, the first slit valve door seal compartment decoupled from the main assembly; and
a seal assembly coupling the first slit valve door seal compartment to the main assembly.

2. The load lock chamber of claim 1, wherein the seal assembly further comprises:
a ribbon shaped gasket having a first lateral edge clamped against the main assembly and a second first lateral edge clamped against the first slit valve door seal compartment.

3. The load lock chamber of claim 2, wherein the ribbon is annular and flexible.

4. The load lock chamber of claim 2, wherein the ribbon further comprises:
a first plurality of holes arranged along the first lateral edge; and
a second plurality of holes arranged along the second lateral edge.

5. The load lock chamber of claim 4 further comprising:
at least a first clamp block coupled by fasteners passing through the first plurality of holes to the main assembly; and
at least a second clamp block coupled by fasteners passing through the second plurality of holes to the first slit valve door seal compartment.

6. The load lock chamber of claim 1, wherein the seal assembly further comprises:
a substantially rectangular tube circumscribing the aperture of the slit valve door compartment.

7. The load lock chamber of claim 2, wherein the ribbon further comprises:
a first annular ridge extending from the ribbon inward of the first plurality of holes; and
a second annular ridge extending from the ribbon inward of the second plurality of holes.

8. The load lock chamber of claim 2, wherein the ribbon further comprises:
an annular wave between the first and second lateral edges.

9. The load lock chamber of claim 1, wherein the main assembly and the first slit valve door seal compartment further comprise:
facing sides coupled by the seal assembly, wherein the facing sides together form a stepped recess, the seal assembly disposed in an upper portion of the recess, a lower portion of the recess positioned between the seal assembly and the substrate access port circumscribed by the seal assembly.

10. The load lock chamber of claim 9, wherein an interface between the upper and lower portions of the recess is rounded.

11. The load lock chamber of claim 1 further comprising:
a plurality of quartz tubes extending into the main assembly; and
a lamp disposed in each to the tubes.

12. The load lock chamber of claim 1 further comprising:
a first clamp block securing the seal assembly to the main assembly, a lower corner of the first clamp block facing the first slit valve door seal compartment being rounded; and
a second clamp block securing the seal assembly to the first slit valve door seal compartment, a lower corner of the second clamp block facing the main assembly being rounded.

13. The load lock chamber of claim 1 further comprising:
a plurality of first clamp blocks securing the seal assembly to the main assembly; and
a plurality of second clamp blocks securing the seal assembly to the first slit valve door seal compartment.

14. The load lock chamber of claim 13, wherein the plurality of first clamp blocks further comprises:
at least four L-shaped corner sections.

15. The load lock chamber of claim 13, wherein the first clamp blocks are disposed in the substrate access port circumscribed by the seal assembly.

16. The load lock chamber of claim 1 further comprising:
a second slit valve door seal compartment having an aperture adjacent and aligned with one of the access ports, the second slit valve door seal compartment decoupled from the main assembly; and
a second seal assembly coupling the second slit valve door seal compartment to the main assembly.

17. A load lock chamber, comprising:
a main assembly having a substrate transfer cavity, a first substrate access port and a second substrate access port formed through the main assembly, the substrate access ports fluidly coupled to the cavity;
a first slit valve door seal compartment having a substrate transfer passage, the substrate transfer passage having a port adjacent and aligned with the first access port, the first slit valve door seal compartment decoupled from the main assembly;
a slit valve door engaging a sealing face of the first slit door seal compartment to selectively seal the first substrate transfer passage and first substrate access port; and
an annular resilient seal forming a seal between the first slit valve door seal compartment and the main assembly.

18. The load lock chamber of claim 17, wherein the first slit valve door seal compartment and the main assembly are in a spaced-apart relation.

19. The load lock chamber of claim 17, wherein the annular resilient seal has a substantially cylindrical form having a centerline orientated parallel or superimposed with a centerline of the first substrate port through the main assembly.

20. A load lock chamber, comprising:
a main assembly having a substrate transfer cavity and at least six substrate access ports formed through the main assembly, the substrate access ports fluidly coupled to the cavity;
a first slit valve door seal compartment having a first substrate transfer passage, a second substrate transfer passage and a third substrate transfer passage, the substrate transfer passages of the first slit valve door seal compartment aligned with respective first, second and third substrate access ports of the main assembly, the first slit valve door seal compartment disposed in a spaced-apart relation to the main assembly;
a first slit valve door disposed in the first slit door seal compartment, the first slit valve door selectively engaging a sealing face of the first slit door seal compartment to selectively seal the first substrate transfer passage;
a second slit valve door disposed in the first slit door seal compartment, the second slit valve door selectively engaging a sealing face of the first slit door seal compartment to selectively seal the second substrate transfer passage;
a third slit valve door disposed in the first slit door seal compartment, the third slit valve door selectively engaging a sealing face of the first slit door seal compartment to selectively seal the third substrate transfer passage;
a first cylindrical resilient seal forming a seal between the first slit valve door seal compartment and the main assembly;
a second slit valve door seal compartment having a first substrate transfer passage, a second substrate transfer passage and a third substrate transfer passage, the substrate transfer passages of the second slit valve door seal compartment aligned with respective fourth, fifth and sixth substrate access ports of the main assembly, the second slit valve door seal compartment disposed in a spaced-apart relation to the main assembly;
a fourth slit valve door disposed in the second slit valve door seal compartment, the fourth slit valve door selectively engaging a sealing face of the second slit valve door seal compartment to selectively seal the fourth substrate transfer passage;
a fifth slit valve door disposed in the second slit valve door seal compartment, the fifth slit valve door selectively engaging a sealing face of the second slit valve door seal compartment to selectively seal the fifth substrate transfer passage;
a sixth slit valve door disposed in the second slit valve door seal compartment, the sixth slit valve door selectively engaging a sealing face of the second slit valve door seal compartment to selectively seal the sixth substrate transfer passage; and
a second cylindrical resilient seal forming a seal between the second slit valve door seal compartment and the main assembly.

* * * * *

UNITED STATES PATENT AND TRADEMARK OFFICE
CERTIFICATE OF CORRECTION

PATENT NO. : 8,124,907 B2
APPLICATION NO. : 11/782267
DATED : February 28, 2012
INVENTOR(S) : Lee et al.

Page 1 of 1

It is certified that error appears in the above-identified patent and that said Letters Patent is hereby corrected as shown below:

In the Claims:

Column 14, Claim 2, Line 50, please delete "first";

Column 15, Claim 6, Line 4, please insert -- first -- after the;

Column 15, Claim 6, Line 4, please insert -- seal -- after door;

Column 15, Claim 17, Line 60, please insert -- substrate -- after first;

Column 15, Claim 17, Line 63, please insert -- valve -- after slit;

Column 15, Claim 17, Line 64, please delete "first";

Column 16, Claim 19, Line 9, please insert -- access -- after substrate;

Column 16, Claim 20, Line 23, please insert -- valve -- after slit;

Column 16, Claim 20, Line 25, please insert -- valve -- after slit;

Column 16, Claim 20, Line 27, please insert -- valve -- after slit;

Column 16, Claim 20, Line 29, please insert -- valve -- after slit;

Column 16, Claim 20, Line 32, please insert -- valve -- after slit;

Column 16, Claim 20, Line 34, please insert -- valve -- after slit.

Signed and Sealed this
Twenty-ninth Day of January, 2013

David J. Kappos
*Director of the United States Patent and Trademark Office*